United States Patent
Yamazaki

[19]
[11] Patent Number: 6,133,119
[45] Date of Patent: *Oct. 17, 2000

[54] PHOTOELECTRIC CONVERSION DEVICE AND METHOD MANUFACTURING SAME

[75] Inventor: Shunpei Yamazaki, Atsugi, Japan

[73] Assignee: Semiconductor Energy Laboratory Co., Ltd., Kanagawa-ken, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/890,439

[22] Filed: Jul. 9, 1997

[30] Foreign Application Priority Data

Jul. 8, 1996 [JP] Japan .................................. 8-197127
Jul. 15, 1996 [JP] Japan .................................. 8-205384

[51] Int. Cl.[7] ................................................. H01L 21/322
[52] U.S. Cl. .......................... 438/476; 438/471; 438/764
[58] Field of Search .................................. 438/764, 765, 438/471–477

[56] References Cited

U.S. PATENT DOCUMENTS

| | | | |
|---|---|---|---|
| 4,561,171 | 12/1985 | Shlosser ........................................ | 438/58 |
| 5,085,711 | 2/1992 | Iwamoto et al. ........................... | 136/258 |
| 5,089,441 | 2/1992 | Moslehi ....................................... | 438/800 |
| 5,225,355 | 7/1993 | Sugino et al. .............................. | 438/396 |
| 5,244,819 | 9/1993 | Jue ............................................. | 438/402 |
| 5,275,851 | 1/1994 | Fonash et al. .............................. | 438/479 |
| 5,380,372 | 1/1995 | Campe et al. .............................. | 136/258 |
| 5,403,772 | 4/1995 | Zhang et al. ............................... | 438/166 |
| 5,422,302 | 6/1995 | Yonehara et al. .......................... | 438/153 |
| 5,426,061 | 6/1995 | Sopori ......................................... | 438/475 |
| 5,426,064 | 6/1995 | Zhang et al. ............................... | 438/166 |
| 5,481,121 | 1/1996 | Zhang et al. ............................... | 257/64 |
| 5,488,000 | 1/1996 | Zhang et al. ............................... | 438/166 |
| 5,492,843 | 2/1996 | Adachi et al. .............................. | 438/479 |
| 5,501,989 | 3/1996 | Takayama et al. ......................... | 438/155 |
| 5,508,533 | 4/1996 | Takemura .................................... | 257/64 |
| 5,527,718 | 6/1996 | Seita et al. .................................. | 438/471 |
| 5,529,937 | 6/1996 | Zhang et al. ............................... | 438/471 |
| 5,534,716 | 7/1996 | Takemura .................................... | 257/72 |
| 5,543,352 | 8/1996 | Ohtani et al. ............................... | 438/487 |
| 5,563,426 | 10/1996 | Zhang et al. ............................... | 257/66 |
| 5,569,610 | 10/1996 | Zhang et al. ............................... | 438/166 |
| 5,569,936 | 10/1996 | Zhang et al. ............................... | 257/66 |
| 5,580,792 | 12/1996 | Zhang et al. ............................... | 438/166 |

(List continued on next page.)

FOREIGN PATENT DOCUMENTS

3049226 3/1982 Germany .
5-109737 4/1993 Japan .

OTHER PUBLICATIONS

Stanley Wolf et al. Silicon Processing for the VLSI Era, vol. 1: Process Technology, pp. 61–70, Feb. 1996.
Z. Li et al. "Gettering in High Resistive Float Zone Silicon Wafers For Silicon Detector Applicatons", IEEE, pp. 290–294, Feb. 1989.
A. Rohatgi et al. "Investigation of the Effects of Aluminum Treatment on Silicon Solar Cells", IEEE, pp. 52–57, Jan. 1993.
W. Skorupa et al. "Heavy Metal Gettering in Buried Nitride Silicon–on–Insulator Structures", Electroonic Letters, pp. 464–465, Apr. 1988.
Ghandhi "VLSI Fabrication Principles", pp. 587–588, Jul. 1984.

*Primary Examiner*—Carl Whitehead, Jr.
*Assistant Examiner*—Maria Guerrero
*Attorney, Agent, or Firm*—Fish & Richardson P.C.

[57] ABSTRACT

Catalytic elements such as Ni are intentionally combined with defects that remain inside of a semiconductor substrate or thin film so that the energy state of the defects comes to a stable state. In this state, a heat treatment is conducted in an atmosphere containing halogen element or XV element, and gettering is conducted in such a manner that the catalytic element is taken in an oxide film. The bonds which are divided by separating the catalytic element are recombined through a heat treatment, thereby being capable of improving crystalline property of the semiconductor substrate or thin film remarkably.

54 Claims, 19 Drawing Sheets

HEAT TREATMENT FOR Ni DIFFUSION

HEAT TREATMENT IN ATMOSPHERE CONTAINING HCl

U.S. PATENT DOCUMENTS

| | | | |
|---|---|---|---|
| 5,585,291 | 12/1996 | Ohtani et al. | 438/486 |
| 5,589,694 | 12/1996 | Takayama et al. | 257/67 |
| 5,595,923 | 1/1997 | Zhang et al. | 438/162 |
| 5,595,944 | 1/1997 | Zhang et al. | 438/158 |
| 5,604,360 | 2/1997 | Zhang et al. | 257/72 |
| 5,605,846 | 2/1997 | Ohtani et al. | 438/487 |
| 5,606,179 | 2/1997 | Yamazaki et al. | 257/59 |
| 5,608,232 | 3/1997 | Yamazaki et al. | 257/66 |
| 5,612,250 | 3/1997 | Ohtani et al. | 438/795 |
| 5,614,426 | 3/1997 | Funada et al. | 438/150 |
| 5,614,733 | 3/1997 | Zhang et al. | 257/66 |
| 5,616,506 | 4/1997 | Takemura | 438/150 |
| 5,620,910 | 6/1995 | Teramoto | 438/151 |
| 5,621,224 | 4/1997 | Yamazaki et al. | 257/66 |
| 5,624,851 | 4/1997 | Takayama et al. | 438/166 |
| 5,637,515 | 6/1997 | Takemura | 438/162 |
| 5,639,698 | 6/1997 | Yamazaki et al. | 438/486 |
| 5,643,826 | 7/1997 | Ohtani et al. | 438/162 |
| 5,646,424 | 7/1997 | Zhang et al. | 257/66 |
| 5,654,203 | 8/1997 | Ohtani et al. | 438/97 |
| 5,656,825 | 8/1997 | Kusumoto et al. | 257/66 |
| 5,663,077 | 9/1997 | Adachi et al. | 438/151 |
| 5,700,333 | 12/1997 | Yamazaki et al. | 136/258 |
| 5,821,138 | 10/1998 | Yamazaki et al. | 438/166 |
| 5,869,363 | 2/1999 | Yamazaki et al. | 438/166 |
| 5,985,740 | 11/1999 | Yamazaki et al. | 438/486 |
| 6,048,758 | 4/2000 | Yamazaki et al. | 438/166 |

HEAT TREATMENT FOR Ni DIFFUSION

HEAT TREATMENT IN ATMOSPHERE CONTAINING HCl

HEAT TREATMENT IN ATMOSPHERE CONTAINING HALOGEN

HEAT TREATMENT FOR GETTERING

PHOTOELECTRIC CONVERSION DEVICE AND METHOD MANUFACTURING SAME

BACKGROUND OF THE INVENTION

1. Field of the Invention

The present invention relates to a photoelectric conversion device using a semiconductor substrate, and more particularly to a solar battery. The structure of the solar battery is applicable to the solar batteries of various types using a bulk semiconductor such as a known mono-crystal wafer or polycrystal wafer.

Also, the present invention relates to a photoelectric conversion device using a thin film semiconductor formed on an insulating or conductive substrate for a photoelectric conversion layer, and the solar battery using the thin film semiconductor is applicable to the solar batteries of various types.

The present invention is applicable to a junction type solar battery based on a p-n junction, a non-junction type solar battery having a Schottky barrier, a MIS structure or the like, a multi-layer junction type solar battery, a hetero junction type solar battery and so on.

2. Description of the Related Art

The solar batteries can be manufactured using a variety of semiconductor material or organic compound material, however, from the industrial viewpoint, silicon which is semiconductor is mainly used for the solar batteries. The solar batteries using silicon can be roughly classified into a bulk type solar battery using a wafer of mono-crystal silicon, polycrystal silicon or the like and a thin film solar battery having a silicon film formed on a substrate.

Also, the reduction of the manufacture costs has been required for the spread of the solar batteries, and in particular, the thin film solar battery has been expected to provide the effects of the reduced costs because the raw material used for the thin film solar battery is reduced in comparison with the bulk type solar battery.

At present, in the field of the thin film solar battery, an amorphous silicon solar battery has been put to practical use. However, because the amorphous silicon solar battery is lower in conversion efficiency than the solar batteries using mono-crystal silicon or polycrystal silicon, and also suffers from problems such as light deterioration, its use is limited. For that reason, as another means, the thin film solar battery using a crystalline silicon film has also been developed.

As mentioned above, although the high conversion efficiency and the reduction of the manufacture costs are required at the same time for the solar battery, both are substantially contrary to each other. For example, in the case of pursuing the conversion efficiency, it can be relatively readily achieved by using the mono-crystal wafer of a high grade (defects and the like are remarkably reduced) although the manufacture costs are increased as much.

On the contrary, under existing circumstances, even though the costs can be reduced by using the mono-crystal wafer of a low grade (so-called solar battery grade, etc.), the conversion efficiency is slightly lowered unavoidably. In particular, the polycrystal wafer, the thin film solar battery and so on have been developed for primarily reducing the costs, so that the conversion efficiency is subordinate to the reduction of the costs.

Also, in view of the low costs, attention has been paid particularly to the thin film solar battery using the crystalline silicon thin film. However, since the crystalline silicon thin film, for example, the mono-crystal silicon thin film is small in absorption coefficient, the thin film solar battery suffers from such a problem that it does not sufficiently function as the photoelectric conversion device without thickening the film. Since a grain boundary always exists in the polycrystal silicon thin film generally obtained, the grain boundary forms an electronic state having an energy corresponding to a forbidden band, to thereby shorten the lifetime of carriers. In other words, when the film is thickened, the carriers are recombined before they reach an electrode, thereby making it difficult to ensure a sufficient photoelectric conversion efficiency.

SUMMARY OF THE INVENTION

As described above, importance has been brought into the development of the solar battery to which attention has been paid as a new energy source in recent years, and a large problem on how to manufacture a solar battery high in conversion efficiency while restraining the manufacture costs arises toward the development of an energy in the future.

The present invention has been made to solve the above problem, and therefore an object of the present invention is to provide a technique by which a crystalline silicon substrate of a low grade (for example, a solar battery grade, etc.) frequently used in a bulk type solar battery is changed into a silicon substrate having a crystalline property of a high grade (for example, a semiconductor grade, etc.).

Then, the first object of the present invention is to provide a bulk type solar battery that can achieve a high conversion efficiency and the low costs together by manufacturing the solar battery using the crystalline silicon substrate having the high crystalline property.

A second object of the present invention is to provide a technique by which a crystalline silicon thin film that forms a photoelectric conversion region is formed of a crystalline silicon thin film which is reduced in defects and has a high crystalline property, etc., more than those of the conventional crystalline silicon thin film.

Then, the second object of the present invention is to provide a bulk type solar battery that can achieve a high conversion efficiency and the low costs together by manufacturing the solar battery using the crystalline silicon thin film having the high crystalline property.

In order to solve the above problems, according to the present invention, in a photoelectric conversion device using a semiconductor substrate having crystalline property, catalytic elements are segregated in defects inside of the semiconductor substrate.

Thereafter, while the catalytic elements within the semiconductor substrate are gettered by halogen elements or the elements of group XV, the defects inside of the semiconductor substrate are removed.

The above semiconductor substrate may be a substrate using Si material, GaAs material or CdS material. More particularly, as a general example, it may be a mono-crystal silicon wafer or a polycrystal silicon wafer. At present, there have been known a variety of means for forming the solar battery on the silicon wafer.

For example, it is generally structured such that a layer having a weak reverse conductive type (an n-type layer) is formed, for example, on a surface of a p-type silicon wafer, to form a p-n junction, carriers collected on the n-type layer are drawn out to obtain a current. Also, apart from the p-n junction, there is a case in which a junction form such as a p-i-n junction (in case of crystalline silicon, it is substantially directed to a $p^+$-p-n junction, $p^+$-$p^-$-n junction, etc.) is applicable.

Also, according to the present invention, a semiconductor substrate having a crystalline property and a layer containing catalytic elements which is in close contact with an upper surface of the semiconductor substrate are subjected to a heat treatment, and thereafter while the catalytic elements inside of the crystalline semiconductor thin film are segregated by halogen elements or the elements of group XV, the defects inside of the semiconductor thin film are removed.

In the above structure, the substrate material may be, for example, ceramic, stainless steel, metal silicon, tungsten, quartz, sapphire, etc. Also, although a variety of means for manufacturing the thin film solar battery have been reported, the present invention is applicable not only to the structure and manufacture method of the solar battery but also to wide fields.

For example, there is a method in which impurities such as P(phosphorus) which give a reverse conductive type are added to a crystalline silicon thin film having a substantially intrinsic i-type (or weak p-type) in the vicinity of a main surface thereof (a side to which a solar light is made incident), to form an i-n (or p-n) junction. Also, there is a case in which a crystalline silicon layer having an n-type is laminated on a crystalline silicon thin film to form an i-n (or p-n) junction. Further, a p-i-n junction in which a p-type conductive layer, a substantially intrinsic i-type conductive layer and an n-type conductive layer are laminated may be formed as occasions demand.

The solar battery formed in the above manner is structured such that carriers are produced by light excitation on a junction of the i-type (or p-type) layer and the n-type layer, and the carriers collected on the n-type layer are drawn out by an electrode to obtain a current. Also, there is a case in which a junction such as a $p^+$-p junction is used other than the p-n junction and the p-i-n junction.

The basic object of the present invention is to use an action that promotes the crystallization of catalytic elements in order to improve the crystalline property of the photoelectric conversion region in the photoelectric conversion device such as the bulk type solar battery or the thin film solar battery, etc.

However, although the catalytic elements has the action that promotes the crystallization, they have a risk that the electric characteristics and the reliability are lowered when the catalytic elements are contained in the photoelectric conversion region. For that reason, in the present invention, in order to remove the catalytic elements from the photoelectric conversion region, the gettering action of halogen elements or the elements of group XV is used.

In the above-mentioned structure, the catalytic elements may be Fe, Co, Pt, Cu, Au or the like. The method of forming the catalytic element layer may be the plasma processing method, the vapor deposition method, the spin coating method and so on. Preferably, the vapor deposition method and the spin coating method are advantageous because they are difficult to damage the semiconductor substrate surface or the semiconductor thin film. In particular, the present inventors mainly apply the spin coating method because it is excellent in the controllability of the added amount of the catalytic elements.

Also, in the above-mentioned structures, the method of gettering the catalytic elements is roughly divided into two kinds of methods. A first method is a method of conducting a heat treatment in an atmosphere containing halogen elements therein. It is particularly preferable that the halogen elements available to gettering are Cl(chlorine) and F(fluorine). The gas used for adding the halogen elements to the atmosphere is one or a plurality of kinds selected from HCl, HF, HBr, $Cl_2$, $NF_3$, $ClF_3$, $F_2$ and $Br_2$.

A second method is a method in which a layer containing elements belonging to group XV are formed in contact with a surface of a semiconductor substrate or a surface of a semiconductor thin film, and the surface of the semiconductor substrate or the surface of the semiconductor thin film, and the layer containing elements belonging to group XV are subjected to a heat treatment.

For the formation of the layer containing the elements belonging to group XV, there can be applied a liquid layer method or a gas phase method. For example, a silicon oxide film or a silicon film to which the elements belonging to group XV have been added may be formed.

Alteratively, there can be applied a method in which the elements belonging to group XV are introduced into the semiconductor substrate or the semiconductor thin film through the ion-implantation method, the plasma doping method or the like.

The elements belonging to group XV may be N(nitrogen), P(phosphorus), As(arsenic), Sb(antimony) and Bi(bismuth). In particular, P exhibits a remarkable gettering effect.

Also, it is important that the concentration of the elements belonging to group XV within the layer containing the elements belonging to group XV is set to be higher at least by one digit than the concentration of catalyst within the semiconductor substrate or the semiconductor thin film. For example, if the concentration of catalyst within the semiconductor substrate in which the catalyst was segregated is approximately $1 \times 10^{19}/cm^3$, then the concentration of the elements of group XV within the layer containing the elements that belongs to group XV is set to be $1 \times 10^{20}/cm^3$ or more.

Also, in gettering using the halogen elements or the elements belonging to group XV, the effect of gettering changes according to a heat temperature and a heat period. For that reason, the conditions of the heat treatment for gettering may be set appropriately considering the characteristic of a material such as a heat resistance of the substrate, the productivity, the economics or the like.

Now, a description will be given in more detail of preferred embodiments of the present invention with reference to the accompanying drawings.

A embodiment of the present invention will be described with reference to FIGS. 1A to 1D. The first embodiment of the present invention is related to a bulk type solar battery and shows an example using halogen elements to remove Ni that is used as catalytic elements.

In FIG. 1A, reference numeral 101 denotes a semiconductor substrate that is a mono-crystal silicon substrate of the solar battery grade in this example. In FIG. 1A, what are indicated by marks "X"s inside of the semiconductor substrate 101 are defects that slightly remain inside of the mono-crystal silicon. The defects are dislocations, non-bonds or the like, and are difficult to remove unless a heat treatment at a very high temperature of 1,100° C. or higher is conducted.

It is needless to say that another silicon substrate having the crystalline property can be applied. Therefore, although this embodiment shows an example using a monocrystalline silicon substrate, for example, a polycrystal silicon substrate may be applied likewise.

Subsequently, a layer containing Ni(nickel) elements is formed on a surface of the semiconductor substrate 101. The formation of a Ni layer 102 can be achieved by using the plasma processing method, the vapor deposition method, the spin coating method, or the like. Preferably, the vapor deposition method and the spin coating method are advantageous because they are difficult to damage the surface of the substrate. In particular, the spin coating method is excellent in controllability when a very small amount of Ni is added to the semiconductor substrate, and therefore the present inventors mainly apply this method.

After a state shown in FIG. 1A is thus obtained, a heat treatment is conducted at a temperature ranging from 450 to 700° C. It is preferable that the heat treatment is conducted under an inactive atmosphere. The heat treatment allows Ni elements to diffuse from the Ni layer 102, to thereby produce Si—Ni bonds in the defects indicated by the marks "X"s by priority. The reason why the defects indicated by the marks "X"s in FIG. 1A are indicated by marks "O"s in FIG. 1B is to represent such a fact that the Ni elements are bonded to the defects so that the defects are substantially compensated.

Through a heat treatment shown in FIG. 1B, the Ni layer 102 reacts with the semiconductor substrate 101 so that a nickel silicide layer 103 is formed on the surface of the semiconductor substrate 101. It is desirable that the nickel silicide layer 103 is previously etched and removed with chemicals such as hydrofluoric acid prior to an Ni gettering process which will be conducted succeedingly, because the nickel silicide layer 103 contains Ni elements at a high concentration.

Subsequently, the Ni elements diffused inside of the semiconductor substrate 101 are removed by gettering. The elements applicable for gettering are preferably halogen elements such as Cl or F. A gas for introducing the halogen elements is one or a plurality of kinds selected from HCl, HF, HBr, $Cl_2$, $NF_3$, $F_2$ and $Br_2$.

This embodiment shows an example in which the gettering process is conducted through the gas phase method using a gas containing the above halogen gas as its component, representatively a gas such as HCl or $NF_3$. This process is conducted at a temperature ranging from 700 to 1100° C. and in a state where the gas such as HCl or $NF_3$ is—contained in the atmosphere where the heat treatment was conducted.

In a state thus obtained as shown in FIG. 1C, most of the Ni elements that existed inside of the semiconductor substrate 101 are gettered and removed by the halogen elements so that the Ni elements are taken in an oxide film 104 formed on the surface of the semiconductor substrate 101, or are changed into a gas phase and made volatile. Accordingly, no Ni element substantially exists inside of the semiconductor substrate 101, and even though the Ni elements exist therein, its concentration is reduced to $1/10$ to $1/1000$. Specifically, it can be reduced to $5 \times 10^{18}/cm^3$ or less, preferably $5 \times 10^{16}/cm^3$ or less. The concentration of the elements in this specification is defined as a minimum value of a measured value which was measured by SIMS (secondary ion mass spectrometry).

Although the semiconductor substrate 101 contains another metal elements to some degree from the beginning because of the solar battery grade, it is presumed that the impurities inside of the semiconductor substrate 101 are almost removed since those metal elements are also gettered together with the removal of the Ni elements.

Also, it is presumed that during the heat treatment, the following reaction occurs inside of the semiconductor substrate 101. First, it is presumed that when the Ni elements are gettered and eliminated by the halogen elements, the following reaction occurs representatively.

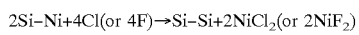

As represented by the above expression, since non-bonds of Si formed by the elimination of Ni are adjacent to each other, they are recombined with each other with an energy less than that of the no-bonds indicated by the marks Xs in FIG. 1A to form Si—Si bonds.

In particular, because $NiCl_2$ is high in volatility, most of $NiCl_2$ is diffused in the gas phase except that a part thereof is taken in a thermally oxidized film during the heat treatment. FIG. 20 is a graph showing a relation between the vapor pressure and the temperature of $NiCl_2$ (nickel chloride) as a reference material. For example, the vapor pressure of $NiCl_2$ at 950° C. is approximately 0.8 atm, and thus represents a pressure close to the atmospheric pressure.

As described above, in the process shown in FIG. 1C, the gettering of Ni elements and recombination of Si with each other are conducted at the same time, thereby being capable of almost eliminating the defects that exist inside of the semiconductor substrate 101.

Therefore, as shown in FIG. 1D, a semiconductor substrate 105 obtained by etching and removing the oxide film 104 is reduced in the concentration of defects in comparison with the semiconductor substrate 101 of the state shown in FIG. 1A, and thus can be regarded as a silicon substrate high in grade which is equal to the silicon substrate of the semiconductor grade.

In the gettering process, the halogen elements exist inside of the semiconductor substrate 101 with the concentration of $1 \times 10^{16}$ to $1 \times 10^{20}/cm^3$. There is many cases in which the halogen elements exist in such a manner that they terminate non-bonds of Si.

Also, this embodiment shows an example in which Ni elements are used as catalytic elements and gettered by halogen elements, however, the same effect can be obtained by using Fe, Co, Pt, Cu, Au or the like as catalytic elements.

As described above, the silicon substrate of the low grade such as the solar battery grade can be changed into the silicon substrate having a high crystalline property which is equal to the silicon substrate of the high grade such as the semiconductor grade in accordance with the present invention. Therefore, a solar battery that achieves a high conversion efficiency can be manufactured using a material as cheap as possible.

After the semiconductor substrate 105 shown in FIG. 1D has been obtained, impurity ions having a conductive type reverse to that of the semiconductor substrate 105 are implanted on an upper surface of the semiconductor substrate 105 (FIG. 1D). Hereinafter, a description will be given assuming that the semiconductor substrate 105 is a p-type silicon substrate.

The impurity ions (P(phosphorus) in this example) are diffused by a heat treatment to form a shallow n-type layer on a surface layer of the semiconductor substrate 105. Since the uppermost surface layer of the n-type layer is damaged by ion implantation, it is desirable that the surface layer is removed by etching or the like through the wet method. Also, in this situation, if a texture structure in which the surface of the n-type layer is intentionally formed uneven is provided, a solar light can be efficiently utilized. Also, as occasions demand, a reflection preventing film may be formed on the texture structure.

Finally, a take-out electrode is formed on each of the front surface and the rear surface of the semiconductor substrate 105 to complete a solar battery. A take-out electrode on a side to which the solar light is made incident needs to be so shaped as not to block the solar battery (for example, sinking comb-shaped). Also, a transparent electrode can be used as the take-out electrode.

The solar battery thus manufactured is formed using the cheap silicon substrate, thereby being capable of restraining the manufacture costs. Furthermore, since the silicon substrate has a crystalline property which is equal to the high grade although it is cheap and of the low grade, the bulk type solar battery that achieves a high conversion efficiency can be manufactured by such a silicon substrate.

Also, in this embodiment, although the method of improving the crystalline property of the semiconductor substrate in the bulk type solar battery was described, if the same process is conducted on the semiconductor thin film of the thin film solar battery, the thin film solar battery that achieves a high conversion efficiency can be achieved.

Another embodiment will be described with reference to FIGS. 3A to 3C. The embodiment of the present invention is related to a bulk type solar battery and shows an example using the elements of group XV to remove Ni that is used as catalytic elements.

In FIG. 3A, catalytic elements (for example, Ni elements) are first held on a surface of a semiconductor substrate 201, and then subjected to a heat treatment to diffuse the Ni elements in the semiconductor substrate 201. Then, the Ni elements are segregated to defects inside of the semiconductor substrate 201 by priority.

Subsequently, a layer 202 containing phosphorus is formed on the surface of the semiconductor substrate 201 through the gas phase method or the liquid layer method. The layer 202 containing phosphorus may be formed by phosphorus silicate glass (PSG) or phosphorus doped polycrystal silicon. Alternatively, phosphorus is implanted in the semiconductor substrate 201 in a shallow manner, thereby being capable of forming an n-type layer.

Then, as shown in FIG. 3B, the semiconductor substrate 201 and the layer 202 containing phosphorus are subjected to a heat treatment. In the case where nickel is used as the catalytic elements, and phosphorus is used as the gettering elements, heating at about 600° C. makes nickel and phosphorus in a stable combination state, that is, $Ni_3P$, $Ni_5P_2$, $Ni_2P$, $Ni_3P_2$, $Ni_2P_3$ and $NiP_3$.

For that reason, nickel in the semiconductor substrate 201 is absorbed by the layer 202 containing phosphorus through the heat treatment shown in FIG. 3B.

In the grain boundary of the semiconductor substrate 201, the unpaired bonds of silicon are combined with nickel to provide silicide in a bond state such as Si—Ni—Si. However, the combination of nickel and silicon is separated by a heat treatment for gettering. Then, since non-bonds of Si formed with the separation of Ni from silicon are adjacent to each other, they are recombined with each other with an energy smaller than that of the non-bonds to form a Si—Si bond.

As described above, in the process shown in FIG. 3B, the gettering of Ni elements and the combination of Si and Si are conducted simultaneously, thereby being capable of almost eliminating the defects that exist inside of the semiconductor substrate 201. Hence, as shown in FIG. 3C, the semiconductor substrate 203 obtained by removing the layer 202 containing phosphorus through etching is smaller in the density of defects than the semiconductor substrate 201 of the state shown in FIG. 3A so that it can be formed as the silicon substrate high in grade which is equivalent to that of the silicon substrate of the semiconductor grade.

It should be noted that the heat treatment for gettering is conducted at 500° C. or higher, preferably, at 550 to 650° C. for 2 hours or longer, preferably, 4 to 12 hours in an electric furnace. The heat treatment atmosphere may be an inactive atmosphere, a hydrogen atmosphere or an oxidizing atmosphere. In particular, with the addition of halogen elements to the oxidizing atmosphere, the effects of gettering can be enhanced.

The semiconductor substrate 203 obtained in the above manner improves in crystalline property in comparison with the original semiconductor substrate. For example, the silicon substrate of the low grade can be changed into a substrate having crystalline property equivalent to that of the silicon substrate of the high grade.

In this embodiment, a method for improving the crystalline property of the semiconductor substrate of the bulk type solar batter was described. If the same processing is conducted on a semiconductor thin film of the thin film solar battery, a thin film solar battery that achieves a high conversion efficiency can be manufactured.

DETAILED DESCRIPTION OF THE PREFERRED EMBODIMENTS (First Embodiment)

A first embodiment of the present invention exhibits an example of manufacturing a photoelectric conversion device such as a solar battery on a monocrystal substrate (silicon wafer) which is of the low grade, particularly called "solar battery grade" as a semiconductor substrate.

Since the present invention is directed to a technique by which the crystalline property of the semiconductor which is a main portion that constitutes a solar battery is improved, the present invention can be applied to the solar batteries of any structures and constructions which are well known. Hence, this embodiment exhibits one example among them, and the present invention is not limited to or by the structures and numeral values in the embodiment.

First of all, a pre-treatment on a silicon substrate will be described with reference to FIGS. 1A to 1D. There is first prepared a silicon substrate 101 of the solar battery grade having a main surface (an upper surface in the figures) a facial orientation of which is (100) face. The thickness of the substrate 101 is 300 $\mu$m. What are indicated by marks "X" are defects that remain inside thereof. Since the silicon substrate for the solar battery takes a somewhat wide permissible range of the density of defects, impurities, etc., inside thereof, it has an advantage that purification at a stage of manufacturing ingot may be rough, with the result that the costs are relatively lowered.

In this embodiment, a p-type silicon substrate generally used is used. Although the substrate may be of an n-type, the conductive types of all elements in this embodiment need be reversed in this case. In other words, the n-type is replaced by the p-type, and the p-type is replaced by the n-type.

Then, a solution containing catalytic elements (Ni elements are exemplified in this embodiment) is coated on the surface of the silicon substrate 101 through the spin coating method. The coating process is conducted as stated below.

A thin oxide film layer (not shown) is formed on the surface of the silicon substrate 101. A method of forming the oxide film layer not shown may be a method in which the substrate is immersed into an excess-water ammonium solution and then processed at 70° C. for 5 minutes, or a method in which it is processed for 5 minutes through the UV processing. The oxide film layer thus formed (not shown) improves in wettability of the silicon surface when it is coated with a nickel salt solution containing Ni elements (for example, nickel acetate salt, nickel nitrate salt, etc.,).

Figure 1A:
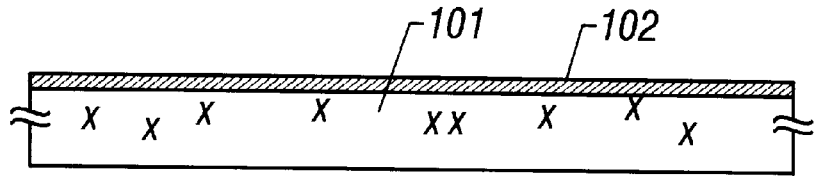
FIGS. 1A to 1D are diagrams for explanation of a process of improving a crystalline property in accordance with a first embodiment of the present invention.

Subsequently, the nickel salt solution is dropped in the center of the substrate that rotates on a rotary support not shown while spinning, to thereby form a thin water film of nickel salt solution over the entire surface of the substrate. Then, the water film is blown out with an increase of the rotation speed of the spin rotation to form a nickel layer 102. In this manner, a state shown in FIG. 1A is obtained.

Then, in the nitrogen atmosphere, the nickel layer 102 is subjected to a heat treatment at a temperature ranging from 550 to 650° C. to diffuse the Ni elements in the substrate 101. In this embodiment, the heat treatment is conducted at 600° C. for 4 hours. Through this heat treatment, Ni elements are diffused into the inside of the silicon substrate 101 and segregated to defects inside of the semiconductor substrate 101 with priority.

Conditions such as the concentration of Ni in the coating solution, the amount of the coating solution, etc., are adjusted so that the amount of Ni elements introduced in the semiconductor film is set to $1 \times 10^{19}$ to $1 \times 10^{20}/cm^3$. If it is less than that concentration, Ni elements are not efficiently segregated to the defects to make it difficult to obtain the effect of the present invention. Also, when it is more than that concentration, gettering at a post-stage is difficult to conduct, which is not preferable.

Figure 1B:
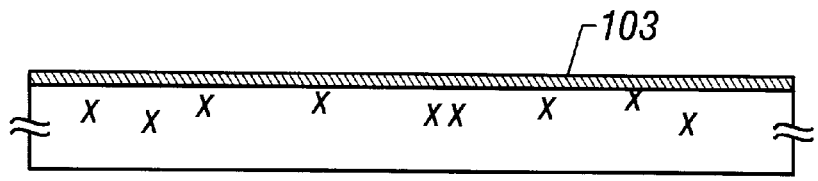

Nickel silicide formed in the defects comes to a combination state excellent in matching because its lattice constant approaches the lattice constant of silicon. Also, the Ni layer 102 reacts with the silicon substrate 101 which is in contact with the Ni layer 102 so that it is changed into a nickel silicide layer 103 containing Ni elements with a high concentration (FIG. 1B).

The significant feature of the present invention resides in that Ni elements which are catalytic elements are intentionally segregated to the defects for the reason that the defects which were in an irregular bond state come to the bond state excellent in matching as described above. This is important in a post-process of gettering Ni elements by halogen elements.

It should be noted that although there is described in this embodiment that Ni elements are effective because the silicon substrate is exemplified, even in the case where other semiconductor substrates (for example, GaAs, CdS or the like) are used, the same effect as that of this embodiment can be obtained by using catalytic elements (preferably, transition metal) the lattice constant of which approaches that of the semiconductor substrate.

Thereafter, the silicon substrate 101 is subjected to an etching process by hydrofluoric acid or the like to remove the nickel silicide layer 103. This is because the nickel silicide layer 103 is disadvantageous in a post-process of removing Ni elements by gettering since the nickel silicide film 103 contains Ni elements with a high concentration.

Then, in the atmosphere containing halogen elements, a heat treatment is conducted at a temperature ranging from 700 to 1100° C., representatively, 800 to 950° C. In this embodiment, the heat treatment is conducted at 950° C. for 30 min in the oxidizing atmosphere with which HCl (hydrogen chloride) of 0.1 to 10 wt %, representatively 3 wt % with respect to oxygen is mixed. Through the heat treatment, Ni elements that have compensated the defects inside of the silicon substrate 101 are gettered by Cl elements and separated.

Ni elements that have been gettered by Cl elements are changed into nickel chloride which is a volatile gas and then diffused in an air, or taken in the interior of the oxide film 104 formed on the surface of the silicon substrate 101, thus removing Ni elements from the interior of the silicon substrate 101.

Therefore, the concentration of Ni elements that remain inside of the silicon substrate 101 becomes extremely low, and after being processed, it is reduced to 1/10 to 1/1000 of the original one. Specifically, the concentration of Ni elements can be reduced to $5 \times 10^{18}/cm^3$ or less, preferably $5 \times 10^{16}/cm^3$ or less. The state in which Ni elements of $5 \times 10^{18}/cm^3$ or more are contained is not preferable because the characteristic of metal is remarkably exhibited in the semiconductor.

In other words, with a reduction of the concentration of Ni to $5 \times 10^{18}$/cm$^3$ or less, preferably $5 \times 10^{16}$/cm$^3$ or less by gettering, the silicon substrate which is not functionally adversely affected can be obtained.

Furthermore, because the non-bonds that remain after Ni elements have been separated approach each other and also are in an active state, Si—Si bond is formed during the heat treatment so that the crystalline property excellent in matching is realized. In other words, the defects are substantially removed.

What attention should be paid to reside in that this process is not conducted only for the purpose of gettering Ni elements. Although the gettering process per se is well known, the object of the present invention is not achieved without the combination of the introduction of the Ni elements, the gettering of Ni elements by halogen elements, and the removal (re-combination) of the defects which is conducted simultaneously while gettering as described above.

Figure 1C:
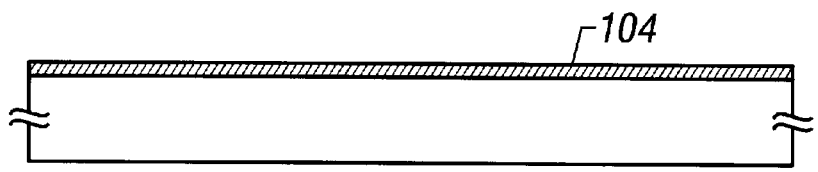

Also, as shown in FIG. 1C, the surface of the semiconductor substrate 101 is oxidized by the heat treatment for gettering to form an oxide film 104. Since this state causes reverse diffusion due to the oxide film 104 containing Ni elements with a relatively high concentration, the oxide film 104 is etched and removed by a hydrofluoric acid solution or the like, thereby being capable of obtaining a silicon substrate 105 as shown in FIG. 1D.

Moreover, it is preferable that the surface layer of the semiconductor substrate 105 is removed by about 0.1 to 1 $\mu$m through the dry etching method or the wet etching method using hydrazine or sodium hydroxide because Ni elements that have been segregated on the boundary between the semiconductor substrate 105 and the oxide film 103 can be also removed.

Figure 1D:
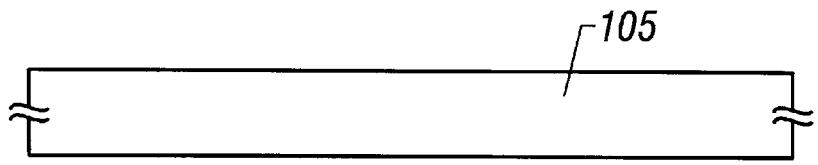

Since the silicon substrate 105 of the state shown in FIG. 1D stood reduced in the defects inside thereof as much as possible although it was originally of the low grade, it has crystalline property to the same degree as that of the monocrystal silicon substrate which is a so-called semiconductor grade. In this manner, the pre-treatment of the silicon substrate is completed. What will be described hereinafter is an example in which a solar battery is manufactured. The description will be given with reference to FIGS. 2A to 2D.

Figure 2A:
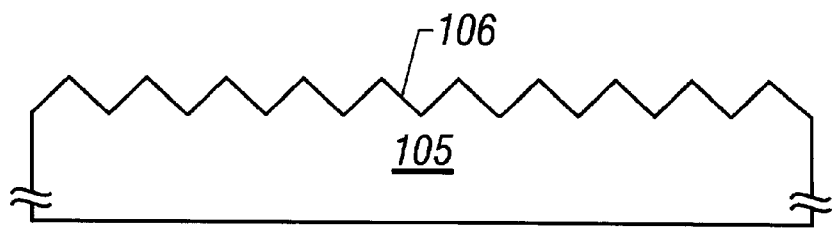
FIGS. 2A to 2D are diagrams for explanation of a process of manufacturing the solar battery in accordance with the first embodiment.

First, in this embodiment, an alkali etching process is conducted on the silicon substrate 105 having (100) face as its main surface (an upper surface in the figures) by using a chemical such as NaOH so that only (111) face is selectively exposed, to thereby produce a texture structure in which an uneven portion (texture portion) 106 is intentionally on an uppermost surface of the silicon substrate 105. As shown in FIG. 2A, the texture structure in which the uneven portion 106 is formed on the surface so that a solar light is scattered to make a longer optical path length, thereby being capable of efficiently absorbing the solar light. Thus, the provision of the texture structure is effective.

In this embodiment, the texture processing is conducted by heating 2% NaOH aqueous solution at 80° C. and etching the surface layer of the silicon substrate 105. The etching is conducted for 5 minutes, and thereafter the silicon substrate 105 is immersed in a boiling water in order to instantly stop reaction and sufficiently cleaned with a pure water. According to the observation of the surface of the silicon substrate 105 through an electron microscope, roughness of about 0.1 to 5 $\mu$m has been observed although it was irregular.

Figure 2B:
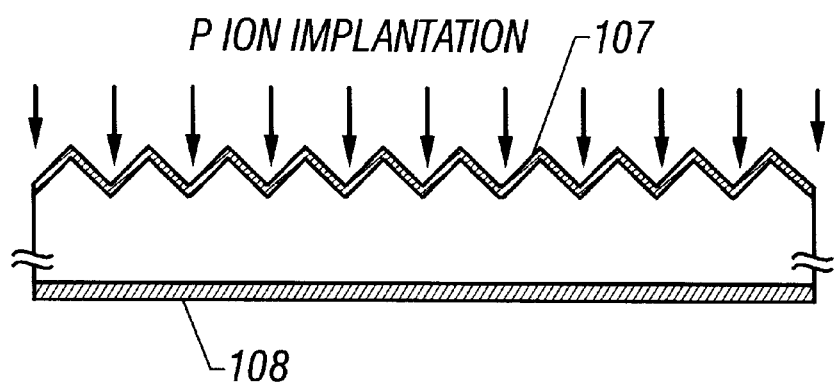

Then, in FIG. 2B, a conductive region having a conductive type (n-type in this embodiment) reverse to that of the silicon substrate 105 is formed on the surface (the upper surface in the figure) of the silicon substrate 105 which has been obtained through the above process. This forming method may be a method of depositing a silicon film having an n-type conductivity, a method of adding impurity elements (for example, P(phosphorus) that gives the n-type conductivity, and so on. In this embodiment, the latter is used.

In this embodiment, as shown in FIG. 2B, the implantation of P ions into the silicon substrate 105 is conducted through the ion doping method or the plasma doping method. The P ions implanted in the vicinity of the surface of the silicon substrate 105 are diffused through a heat treatment to form an n-type conductive region 107.

In the above manner, an excellent p-n junction 108 is formed on a joint portion of the silicon substrate 105 and the conductive region 107. The depth of this joint portion is set to 0.5 $\mu$m in this example. It is preferable that the above ion implanting process is conducted through the ion doping method because the depth of the joint portion is readily controlled.

Since the uppermost surface of the n-type conductive region 107 formed in the above manner is deteriorated in crystalline property with being damaged when ions were implanted, it is preferable that a portion in the vicinity of the surface of the n-type conductive region 107 is etched and removed by hydrazine, sodium hydroxide, or hydrofluoric nitric acid (the mixture of hydrofluoric acid and nitric acid), to thereby remove a region poor in crystalline property.

Subsequently, a reflection preventing film 109 is formed on the n-type conductive region 107. In this embodiment, an SiO$_2$ film 0.1 to 1 $\mu$m in thickness which has been formed through the CVD method is used as the reflection preventing film 109. The thickness of the reflection preventing film 109 need be selected to an optimum value according to the refractive index of the silicon substrate 105 and the refractive index of the reflection preventing film 109. Also, the reflection preventing film 109 may be made of various materials such as SiO, SiN, TiO$_2$, ITO, MgF$_2$ other than the above material.

Figure 2C:
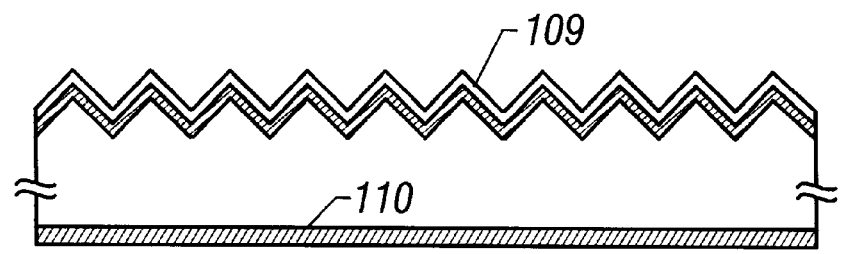

Then, in FIG. 2C, a p$^+$ region 110 having a p-type conductivity higher than that of the semiconductor substrate 105 is formed on a back surface (a lower surface in the figure) of the silicon substrate 105 as BSF (back surface field). Although the formation of the region 110 may be achieved through the solid phase diffusing method, the ion implanting method and so on, the region 110 is formed with a depth of 0.2 $\mu$m by the implantation of ions in this embodiment.

With the BSF structure thus formed, since an electric field can be developed between the silicon substrate 105 and the p$^+$ region 110 by a difference in the Fermi level, minority carriers produced in the substrate 105 which move toward the inner back surface of the silicon substrate 105 is reflected by that surface so that it is liable to reach the p-n junction. In particular, since monocrystal silicon is small in photo absorption coefficient with respect to a long wavelength light, the minority carriers are liable to be produced on a deep portion (in the vicinity of the back surface) of the silicon substrate 105. Since the BSF structure can effectively utilize such carriers, it is effective in improving the sensitivity to the solar light of the long wavelength region.

Finally, take-out electrodes 111 and 112 each formed of a conductive film such as an aluminum film are formed on the conductive region 107 and the p$^+$ region 110. The conductive film may be formed through the sputtering method or the vapor deposition method. Also, when after the formation of the electrodes 111 and 112, they are subjected to a heat treatment at 150 to 300° C. for several minutes, the adhesion of those electrodes 111 and 112 to the under film is enhanced to obtain an excellent electric characteristic.

Further, as occasions demand, a back surface reflection film made of Al, Au, Ag, Cu or the like can be disposed on the back surface side of the silicon substrate 105 (in the case where a solar light is made incident from the upper surface side of the substrate 105 in the figure). With this structure, the solar light which could not be absorbed within the silicon substrate 105 is reflected by the back surface thereof, thereby being capable of improving in the efficiency of using the solar light.

Figure 2D:
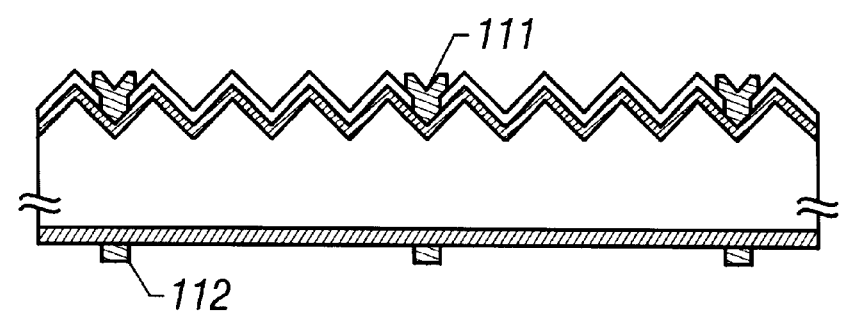

In the above manner, the solar battery shown in FIG. 2D can be manufactured. The solar battery thus manufactured has advantages stated below.

(1) Since the silicon substrate which is a host is low in the costs, the manufacture costs of the solar battery per se can be reduced.

(2) Since the silicon substrate which is low in the costs is remarkably improved in crystalline property according to the present invention, a high conversion efficiency can be realized.

Therefore, the present invention enables a solar battery which is low in the price and high in conversion efficiency to be manufactured. In other words, the present invention provides a technique that greatly contributes to the population of the solar batteries in using the solar batteries in daily life as the coming-generation energy medium.

(Second Embodiment)

A second embodiment shows an example in which a polycrystal silicon substrate is used as a silicon substrate. Since the method of manufacturing the solar battery according to this embodiment is the same as that in the third embodiment, only features obtained only when using the polycrystal silicon substrate will be described below.

The polycrystal silicon substrate has been considered to be effective in lowering the manufacture costs of the solar battery because it is cheaper than the monocrystal silicon substrate. However, because grain boundaries always exist in polycrystal silicon, there arises a problem that carriers produced on the p-n junction are trapped by the grain boundaries and recombined.

In the case of improving the crystalline property of the polycrystal silicon substrate in accordance with the present invention, not only the crystalline property within the respective crystal grains is improved, but also the same effect as that obtained within the crystal grains can be expected on the grain boundaries. In other words, Ni elements added to the inside of the silicon substrate are segregated also on the grain boundaries to form nickel silicide. Then, while a gettering process using halogen elements or phosphorus elements is conducted, non-bonds of Si formed on the grain boundaries are recombined with each other with excellent matching, thereby being capable of substantially reducing an energy gap on the grain boundaries.

As described above, the present invention provides a technique which is sufficiently applicable not only to the monocrystal silicon substrate, but also to the polycrystal silicon substrate. The formation of the solar battery using the polycrystal silicon substrate enables the manufacture costs of the solar battery to be remarkably reduced.

(Third Embodiment)

Although in the first embodiment, catalytic elements (Ni elements) are gettered using HCl gas, a fluorine gas, for example, such as $NF_3$ gas or $ClF_3$ gas can be used instead of HCl gas. In this case, non-bonds are terminated by fluorine during the gettering process, and Si—F bond is preferable to Si—H bond because its bond force is strong.

Also, since $NF_3$ gas is decomposed at a temperature lower than that of HCl gas in the first embodiment, a temperature of the heat treatment can be lowered. In the case where it is necessary to recombine Si with each other through the heat treatment at a relatively high temperature as in the present invention, its advantage cannot be applied. In this example, in the atmosphere where HCl of 0.1 to 10 wt %, representatively 3 wt %, and $NF_3$ gas of 0.1 to 3 wt %, representatively 0.3 wt % are added to oxygen, a heat treatment is conducted at 800° C. for 30 to 60 minutes to getter Ni elements and to remove defects in the silicon substrate.

As described above, the non-bonds of Si are re-combined with each other after the removal of the catalytic elements, and the non-bonds which could not be re-combined are terminated by fluorine, to thereby effectively conduct the removal of the defects.

Similarly, the same effect can be obtained in the case where in the atmosphere where hydrogen of 3 wt %, and $CL_3$ gas of 0.3 wt % are added to oxygen, a wet oxidation process is conducted at a temperature ranging from 500 to 600° C. for 30 to 60 minutes. In this case, since Ni elements are further gettered by Cl elements and F elements, the removal of the defects is more effectively conducted. However, since the temperature is low, the efficiency of re-combinatio n of Si with each other is sacrificed.

(Fourth Embodiment)

In the first to third embodiments, there is exemplified that chlorine and fluorine which are halogen elements are used as the gettering elements. A sixth embodiment shows an example in which phosphorus that belongs to group XV is used as the gettering element, where a layer containing phosphorus is formed through the gas phase method or the liquid layer method. This embodiment will be described with reference to FIGS. 3A to 3C.

There is first prepared a p-type silicon substrate 201 of the solar battery grade having a main surface (an upper surface in the figures) a facial orientation of which is (100) face. The thickness of the substrate 101 is 300 $\mu$m. Then, as in the third embodiment, nickel is introduced into the silicon substrate 201 to segregate nickel to defects.

Figure 3A:
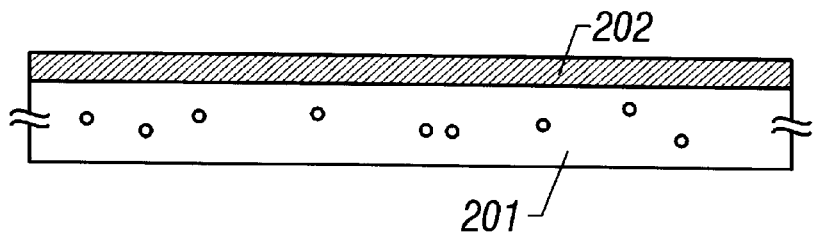
FIGS. 3A to 3C are diagrams for explanation of a process of improving a crystalline property in accordance with fourth and fifth embodiments of the present invention.

Then, a PSG film 202 is formed on a surface of the silicon substrate 201 as the layer containing phosphorus. The PSG film 202 is formed through the atmospheric pressure CVD method with silane, phosphine and oxygen as a raw material. It is important that the concentration of phosphorus within the PSG film 202 is set to be higher at least by one digit than the concentration of nickel within the silicon substrate. For example, if the concentration of nickel within the silicon substrate in which nickel was segregated is approximately $1\times10^{19}/cm^3$, then the concentration of phosphorus within the PSG film 202 is set to be $1\times10^{20}/cm^3$ or more (FIG. 3A).

Figure 3B:
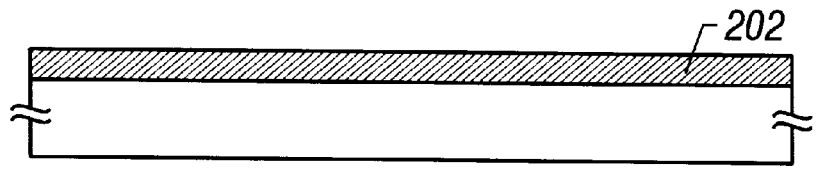

Then, as shown in FIG. 3B, a heat treatment is conducted at 700 to 1100° C. for several hours for gettering. In this embodiment, the heat treatment was conducted at a heat temperature of 1100° C. for 8 hours within an electric furnace which is in the nitrogen atmosphere. Through the heat treatment, Ni elements which have compensated the defects diffused inside of the silicon substrate 201 are gettered by phosphorus inside of the PSG film 202 so as to be removed from the silicon substrate 201.

Hence, the concentration of Ni elements that remains inside of the silicon substrate 201 becomes very low, and is reduced to $\frac{1}{10}$ to $\frac{1}{1000}$ of the original one after being processed. Specifically, it can be set to $5\times10^{18}/cm^3$ or less, preferably $5\times10^{16}/cm^3$ or less. The state in which Ni elements of $5 \times 10^{18}/cm^3$ or more are contained is not preferable because the metal characteristic is remarkably exhibited in the semiconductor. In other words, with a reduction of the concentration of Ni to $5 \times 10^{18}/cm^3$ or less, preferably $5 \times 10^{16}/cm^3$ or less by gettering, a silicon substrate which is not functionally adversely affected as the solar battery can be obtained.

Furthermore, because the non-bonds of Si which has remained after Ni elements have been separated approach each other and also are in an active state, Si—Si bonds are formed during the heat treatment so that the crystalline property excellent in matching is realized. In other words, the defects are substantially removed.

Figure 3C:
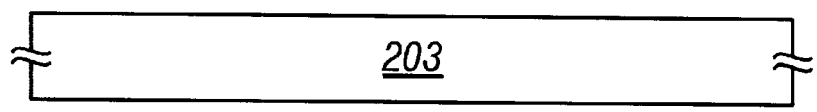

Since this state causes reverse diffusion due to the PSG film 202 containing Ni elements with a relatively high concentration, the PSG film 202 is etched and removed by a hydrofluoric acid solution or the like, thereby being capable of obtaining a silicon substrate 203 the crystalline property of which has been improved as shown in FIG. 3C.

Moreover, it is preferable that the surface layer of the silicon substrate 203 is removed by about 0.1 to 1 $\mu$m through the dry etching method or the wet etching method using hydrazine or sodium hydroxide because Ni elements that have been segregated on the boundary between the silicon substrate 205 and the PSG film 202 can be also removed.

In this embodiment, since the silicon substrate 203 is reduced in the defects inside of the silicon substrate 201 as much as possible by the gettering action of phosphorus although the silicon substrate 201 was originally of the low grade, it has crystalline property to the same degree as that of the monocrystal silicon substrate which is a so-called semiconductor grade. In this manner, the pre-treatment of the silicon substrate is completed. Using the silicon substrate 203 thus obtained, for example, the solar battery described in the first embodiment may be manufactured.

(Fifth Embodiment)

The sixth embodiment shows the example in which the PSG film 202 is formed as the gettering film through the gas phase method. However, a layer containing phosphorus as another gettering film can be formed.

For example, a film can be formed through the liquid phase method. That is, an organic silicide solution to which phosphorus is added is coated on the surface of the silicon substrate 201 through the spin coating method, and thereafter baked to form a silicon oxide film to which phosphorus is added.

Also, it can be formed by an amorphous or polycrystal silicon film to which phosphorus is added through the gas phase method. A phosphorus added layer may be formed in such a manner that phosphorus ions are implanted on the surface of the silicon substrate through the ion implanting method or the plasma doping method. It is preferable that the gettering film is large in the selection ratio of etching to the semiconductor substrate because it is etched and removed after the gettering process. Hence, in the case where a phosphorus added silicon film is used as the gettering film, attention must be paid to the removal of the gettering film.

As a method of facilitating the etching of the phosphorus added silicon film, there is a method in which the phosphorus added silicon film is oxidized in the heating process for gettering. As a result, only the silicon film oxidized can be selectively removed. In order to oxidize silicon, the heat treatment atmosphere may be the oxidizing atmosphere. For example, it may be the mixed gas atmosphere consisting of nitrogen (partial pressure ratio 89%), oxygen (partial pressure ratio 10%) and hydrogen chloride (partial pressure ratio 1%).

Alternatively, a heating time and a heat temperature are controlled to oxidize the silicon film.

(Sixth Embodiment)

In the fourth and fifth embodiments, there is shown the method in which the layer containing phosphorus which forms the gettering film is formed through the gas phase method or the liquid phase method. A sixth embodiment shows a method in which the layer containing phosphorus is formed by doping the semiconductor substrate with phosphorus. Also, in this embodiment, only a pre-treatment on the semiconductor substrate is shown. This embodiment will be described with reference to FIGS. 4A to 4C.

There is first prepared a p-type silicon substrate 211 of the solar battery grade having a main surface (an upper surface in the figures) a facial orientation of which is (100) face. The thickness of the substrate 211 is 300 $\mu$m. Then, through the same process as that in the first embodiment, nickel is segregated into the silicon substrate 211, and nickel silicide layer is removed through the etching process.

Figure 4A:
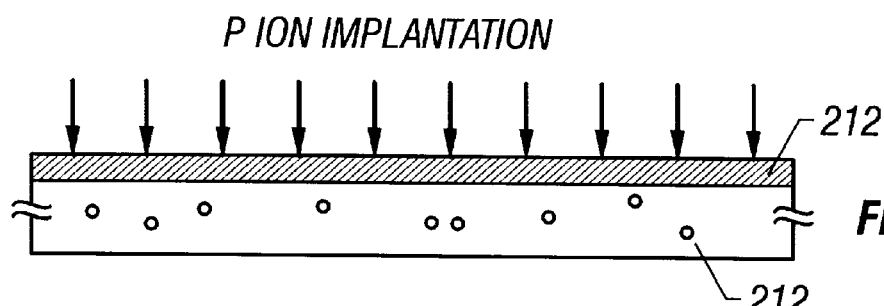
FIGS. 4A to 4C are diagrams for explanation of a process of improving a crystalline property in accordance with a sixth embodiment of the present invention.

Then, as shown in FIG. 4A, a phosphorus is introduced on the surface of the silicon substrate 211 through the ion implanting method and the plasma doping method to form a phosphorus added region 212. In this embodiment, phosphorus is doped using the ion implanting method. As a result, the phosphorus added region 212 becomes a region containing phosphorus with a high concentration, and is made amorphous by an impact of doping. It is important that the concentration of phosphorus within the phosphorus added region 212 is set to be higher at least by one digit than the concentration of nickel within the semiconductor substrate 211. For example, if the concentration of nickel within the semiconductor substrate 211 in which nickel was segregated is approximately $1 \times 10^{19}/cm^3$, then the concentration of phosphorus within the phosphorus added region 212 is set to be $1 \times 10^{20}/cm^3$ or more.

Figure 4B:
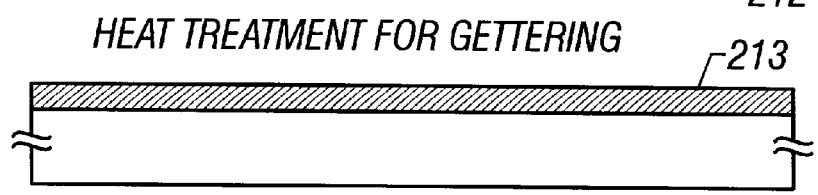

Then, as shown in FIG. 4B, a heat treatment is conducted for gettering. In this embodiment, the heat treatment was conducted at 900° C. for 4 hours within an electric furnace which is in the oxidizing atmosphere that is formed of the mixed gas atmosphere consisting of nitrogen (partial pressure ratio 89%), oxygen (partial pressure ratio 10%) and hydrogen chloride (partial pressure ratio 1%). Through the heat treatment, Ni elements which have compensated the defects diffused inside of the silicon substrate 211 are gettered by phosphorus inside of the phosphorus added region 212 so as to be removed from the silicon substrate 211, and the defects in the silicon substrate 211 are substantially removed. In this embodiment, because the phosphorus added region 212 is made amorphous, not only the gettering effect of phosphorus, but also the synergetic effect of the gettering caused by the defects and dislocation of the crystal structure, and the gettering of chlorine added to the atmosphere can be obtained.

Also, through the heat treatment, the phosphorus added region 212 is oxidized to form a thermal oxide film 213. The thermal oxide film 213 also includes a portion where the semiconductor substrate 211 where phosphorus has not been added has been oxidized. With the oxidation of the phosphorus added region 212, the selection ratio of etching to the silicon substrate 211 can be made large.

Figure 4C:
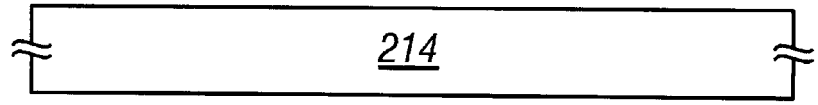

Since the state where the thermal oxide film 213 remains causes reverse diffusion due to the oxide film 213 containing Ni elements with a relatively high concentration, the oxide film 213 is etched and removed by a hydrofluoric acid solution or the like, thereby being capable of obtaining a silicon substrate 214 from which the defects have been removed as shown in FIG. 4C.

With the above processes, the pre-treatment of the silicon substrate is completed. Using the silicon substrate 211 thus obtained, for example, the solar battery described in the third embodiment may be manufactured.

(Seventh Embodiment)

A seventh embodiment shows an example of using a gettering film where phosphorus ions are added on the semiconductor substrate as in the sixth embodiment. In the sixth embodiment, phosphorus ions are added to the entire surface of the semiconductor substrate, the seventh embodiment shows a method of selectively forming a phosphorus added region on the semiconductor substrate.

Hereinafter, this embodiment will be described with reference to FIGS. 5A to 5E.

There is first prepared a p-type silicon substrate 221 of the solar battery grade having a main surface (an upper surface in the figures) a facial orientation of which is (100) face, and having the thickness of 300 $\mu$m. Then, nickel is segregated to the defects within the silicon substrate 211 as in the first embodiment.

Figure 5A:
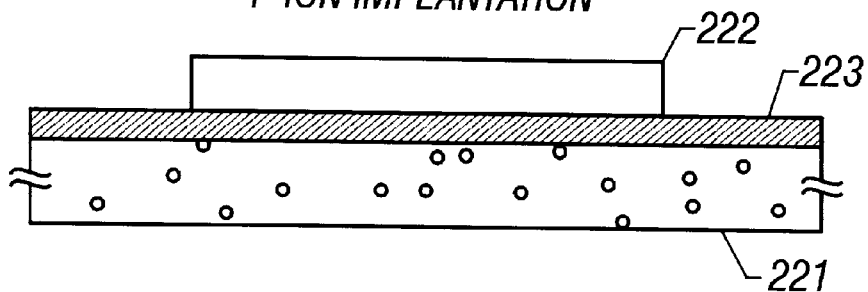
FIG. 5A to 5E are diagrams for explanation of a process of improving a crystalline property in accordance with a seventh embodiment of the present invention.

Then, as shown in FIG. 5A, phosphorus ions are selectively introduced into the silicon substrate 221. For achieving this process, a mask 222 made of silicon oxide is formed on the surface of the silicon substrate 221. After the formation of the mask 222, phosphorus ions are doped using the plasma doping method, as a result of which phosphorus added regions 223 are selectively formed on the silicon substrate 221. It is important that the concentration of phosphorus within the phosphorus added region 223 is set to be higher at least than the concentration of nickel within the silicon substrate 221, and to be at least one digit higher than the concentration of nickel.

Figure 5B:
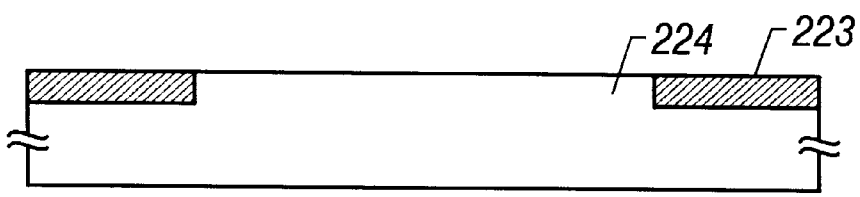

Then, as shown in FIG. 5B, a heat treatment is conducted for gettering. In this embodiment, the heat treatment was conducted at 800° C. for 8 hours within an electric furnace which is in the nitrogen atmosphere. Through the heat treatment, Ni elements which have compensated the defects diffused inside of the silicon substrate 221 are gettered by phosphorus inside of the phosphorus added region 223 so as to be removed from the silicon substrate 221, and the silicon substrate 224 of the semiconductor grade from which the defects in the silicon substrate 221 are substantially removed can be obtained.

With the above processes, the pre-treatment of the silicon substrate is completed. Using the silicon substrate 224 thus obtained, for example, the solar battery described in the first embodiment is manufactured.

Figure 5C:
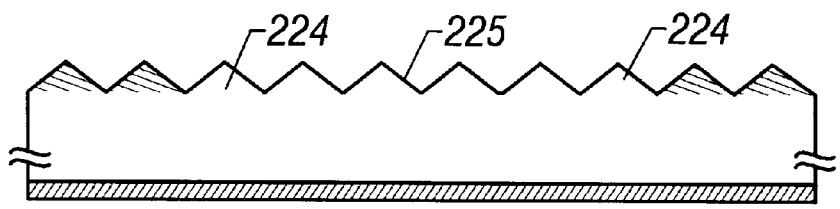

First, as shown in FIG. 5C, the texture process is conducted as in the first embodiment to form an uneven portion 225 on the silicon substrate 224. According to the observation of the surface of the silicon substrate 225 through an electron microscope, roughness of about 0.1 to 5 $\mu$m has been observed although it was irregular.

Then, the implantation of p-ion into the silicon substrate 224 is conducted through the ion doping method or the plasma doping method. The P ions implanted in the vicinity of the surface of the silicon substrate 224 are diffused through the heat treatment to form an n-type conductive region 226. The joint depth of the n-type conductive region 226 is set to 0.5 $\mu$m. As the ion implanting process, the ion doping method is preferable because it facilitates the control of the joint depth.

In this example, since the phosphorus added region 223 used for gettering sink is also a region where phosphorus is added to the semiconductor, it functions as the n-type conductive region. In this manner, in the joint portion of the silicon substrate 224 and the conductive region 226, and in the joint portion of the silicon substrate 224 and the phosphorus added region 223, a p-n junction 227 is formed.

Thereafter, a reflection preventing film 228 is formed on the n-type conductive region 226. In this embodiment, as the reflection preventing film 228, there is used an $SiO_2$ 0.1 to 1 $\mu$m in thickness which has been formed through the CVD method is used. The thickness of this film need be selected to an optimum value according to the refractive factor of the silicon substrate 224 and the refractive factor of the reflection preventing film 228. The reflection preventing film 228 can be made of various materials such as SiO, SiN, $TiO_2$, ITO, $MgF_2$ or the like other than $SiO_2$.

Figure 5D:
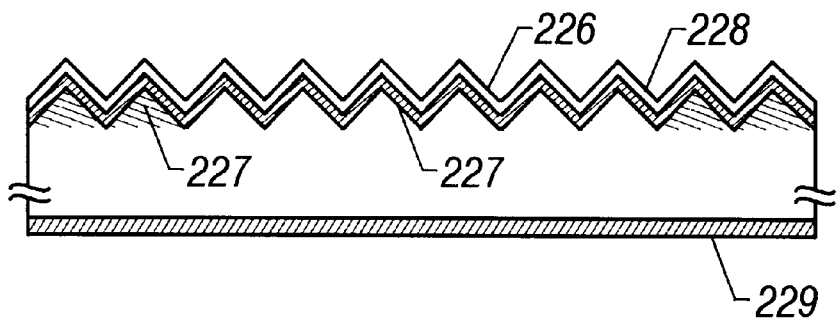

Then, a $p^+$ region 229 is formed in a depth of 0.2 $\mu$m on the back surface (a lower surface in the figure) of the silicon substrate 224 through the ion implantation. With the above processes, a structure shown in FIG. 5D is obtained.

Finally, take-out electrodes 230 and 231 each formed of a conductive film which are connected to the n-type conductive region 226 and the $p^+$ region 229 are formed.

Figure 5E:
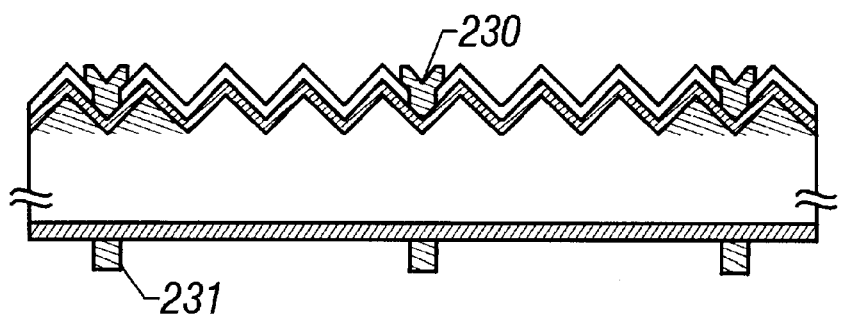

With the above processes, a solar battery shown in FIG. 5E can be manufactured.

In this embodiment, the phosphorus added region 223 which is used for gettering sink is also for the n-type conductive region of the solar battery. However, there is a risk that nickel is reversely diffused in the semiconductor substrate because nickel is gettered in the phosphorus added region 223. Therefore, the phosphorus added region 223 may be removed. For example, in the case of removing the phosphorus added region 223 without any increase in the number of processes, the above removing process may be conducted together with the process of removing the surface layer of the semiconductor substrate 226 which has been gettered by etching or the texture processing.

(Eighth Embodiment)

In the third to ninth embodiments, there is the method in which before manufacturing the solar battery, nickel is added to the semiconductor substrate, and thereafter nickel is gettered to enhance the semiconductor substrate of the solar battery grade to the semiconductor grade in crystalline property. In a tenth embodiment, there is exemplified a method of manufacturing a solar battery that more reduces the concentration of nickel in the semiconductor substrate thus obtained. This embodiment will be described with reference to FIGS. 6A to 6D.

Figure 6A:
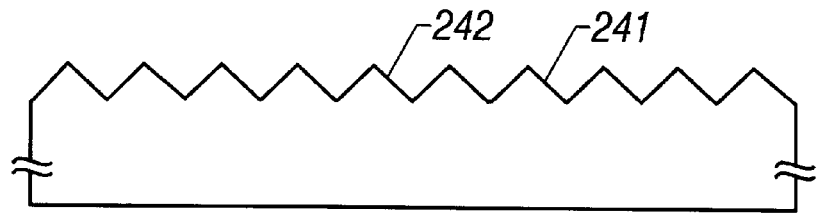
FIGS. 6A to 6D are diagrams for explanation of a process of manufacturing the solar battery in accordance with the eighth embodiment.

First, on the n-type semiconductor substrate which has been subjected to the pre-treatment described in the third to ninth embodiments shown in FIG. 6A, a texture process is conducted as in the third embodiment to form an uneven portion 242 on the silicon substrate 241.

Figure 6B:
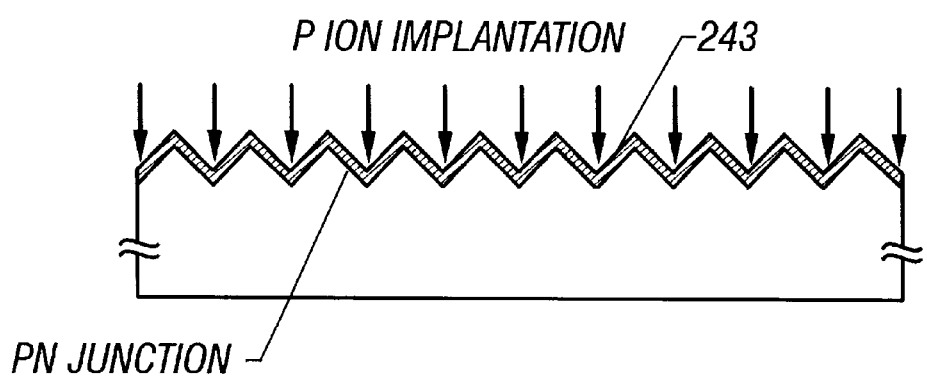
Figure 6C:

Then, as shown in FIG. 6B, P ions are implanted in the depth of 0.5 $\mu$m into silicon substrate 241 to form an n-type conductive region 243. Thereafter, a heat treatment is conducted in the nitrogen atmosphere, and nickel remaining in the silicon substrate 241 is gettered to the n-type conductive region 243. The heat temperature may be set to about 600° C. where the gettering effect can be obtained.

The concentration of nickel inside of the silicon substrate 241 can be set to be $5 \times 10^{16}/cm^3$ or less which is the measurement limit of SIMS or less through the pre-treatment, and further through this heat treatment, the concentration of nickel can be more reduced.

Figure 6D:
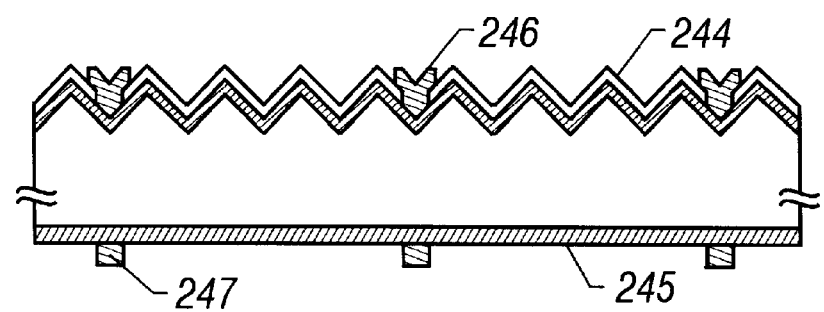

Hereinafter, as shown in FIG. 6D, a reflection preventing film 244 and a p+ region 245 are sequentially formed as in the third embodiment, and take-out electrodes 246 and 247 formed of a conductive film such as an aluminum film are finally formed which are connected to the n-type conductive region 243 and the p+ region 245.

(Ninth Embodiment)

An eleventh embodiment shows an example of manufacturing a solar battery with a structure different from that in the first embodiment. This embodiment will be described with reference to FIGS. 7A to 7D.

Figure 7A:
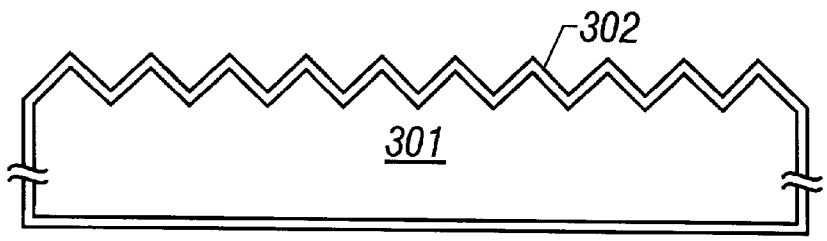
FIGS. 7A to 7D are diagrams for explanation of a process of manufacturing the solar battery in accordance with the ninth embodiment.

First, a state shown in FIG. 7A (the same as the state shown in FIG. 2A) is obtained in the same proceeding as that of the first embodiment. In this state, a texture is formed on a surface of a p-type silicon substrate 301.

In this state, a thermal oxidation process is conducted on the silicon substrate 301. The heat treatment for thermal oxidation is conducted at 1000° C. for 30 minutes in the atmosphere where HCl of 3 wt % is added to oxygen. Through the thermal oxidation process, a thermal oxide film 302 is formed in the thickness of 1000 Å on the entire surface of the silicon substrate 301. The thermal oxidation method is not limited by or to this, and various known means can be used. For example, it may be the dry method, the wet $O_2$ oxidation, pyrogenic oxidation method or the like. Under the atmosphere where halogen elements are added, nickel elements that remain in the semiconductor substrate 301 can be more reduced (FIG. 7A).

Subsequently, the thermal oxide film 302 is selectively removed in such a manner that only regions of the thermal oxide film 302 which are formed on side surfaces of the silicon substrate 301 remain. The removing method may be the dry etching method using a mask by which only the side surfaces of the silicon substrate 301 remain. Through this process, a thermal oxide film 303 remains in a state shown in FIG. 7B.

Figure 7B:
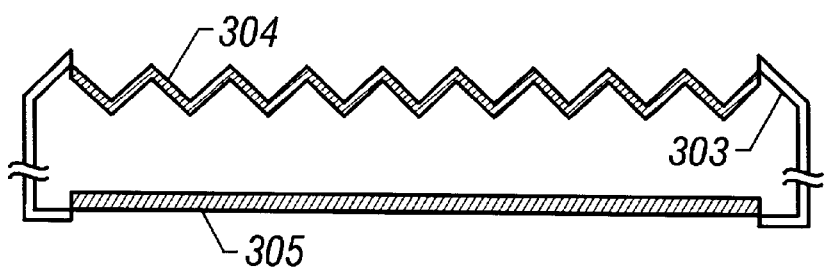
Figure 7C:
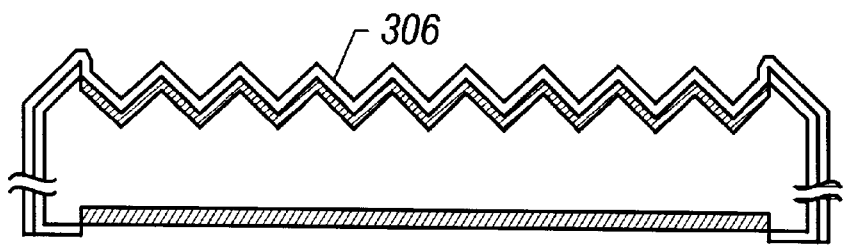

In the state shown in FIG. 7B, p ions that give n-type conductivity are implanted on the surface side of the silicon substrate 301 to form an n-type conductive region (n⁺ region) 304. Also, B ions that give p-type conductivity are implanted on the back surface side to form a conductive region (p⁺ region) 305 which is stronger in conductivity type than that of the silicon substrate 301.

By the way, up to now, in forming the above conductive region, a small number of ions are implanted on the side surfaces of the silicon substrate while going around thereto. As a result, a conductive region, that is, a current path is formed, resulting in a leak current which is a problem. However, according to this embodiment, because thermal oxide film 303 functions as a protective film, there is formed no conductive layer that forms a current path on the side surfaces.

In other words, since the side surfaces of the silicon substrate 301 is protected with the oxide film 303, ions that give n-type or p-type conductivity cannot reach the silicon substrate 301 so as to stop in the oxide film 303. Hence, P and/or B ions are contained with the concentration of $1 \times 10^{16}$ to $1 \times 10^{20}/cm^3$ in the oxide film 303 formed on the side surfaces of the silicon substrate 301.

Then, a silicon nitride film 306 is formed in the thickness of 1000 Å as a passivation film in such a manner that it covers the surface side of the silicon substrate 301. It is preferable that the film forming method is conducted through the reduced pressure thermal CVD method with the prevention of plasma damage. Also, the thickness of the film 306 is appropriately set so that the silicon nitride film 306 functions also as a reflection preventing film.

Subsequently, contact holes (each having a long groove backwardly toward the paper surface) are formed in the silicon nitride film 306, and a take-out electrode 307 is formed on the front surface side of the silicon substrate 301, whereas a take-out electrode 308 is formed on the back surface side of the silicon substrate 301. In this embodiment, the electrode 307 on the front surface side is shaped in sinking comb so that it is liable to receive the solar light. Also, the electrode 308 on the back side surface is shaped in sinking comb. The electrode 308 may be formed on the entire back surface, but since carriers produced on the interface between the electrode and the semiconductor are liable to be recombined, it is desirable that a contact area of the electrode and the semiconductor is reduced as much as possible.

Figure 7D:
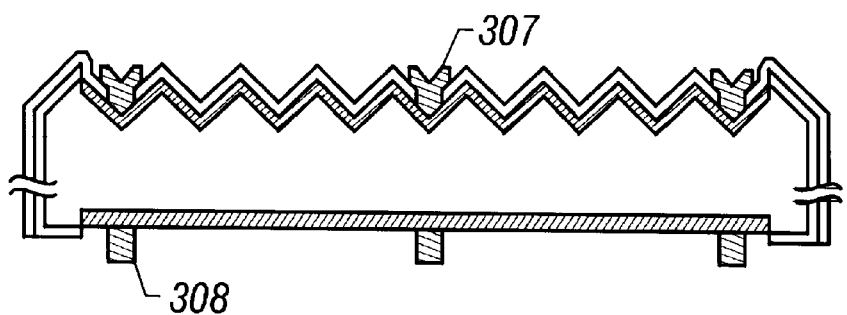

Through the above processes, a solar battery structured as shown in FIG. 7D is completed. In this structure, since no conductive region is formed which forms a current path on the side surfaces of the silicon substrate 301 as described above, no leak current occurs, thereby being capable of realizing the solar battery with a high performance.

(Tenth Embodiment)

A tenth embodiment shows an example of manufacturing a solar battery with a structure different from that in the first to ninth embodiments. This embodiment will be described with reference to FIGS. 8A to 8C.

Figure 8A:
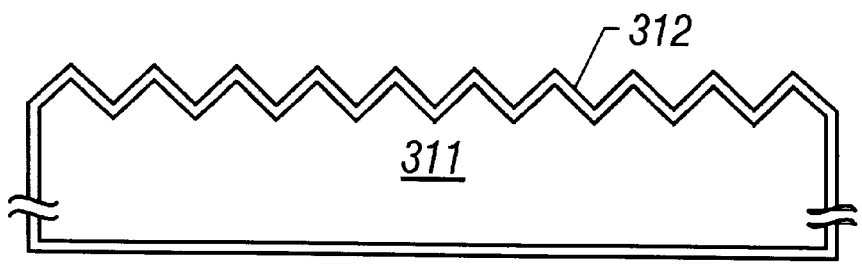
FIGS. 8A to 8C are diagrams for explanation of a process of manufacturing the solar battery in accordance with the tenth embodiment.

First, a state shown in FIG. 8A (the same as that shown in FIG. 2A) is obtained through the same proceedings as those in the first embodiment. In this state, a texture is formed on the surface of a p-type silicon substrate 311.

In this state, a thermal oxidation process is conducted on the silicon substrate 311 to form a thermal oxide film 312. The conditions of the thermal oxidation may be the same as those in the ninth embodiment, or other thermal oxidation methods or other thermal oxidation conditions. In other words, the conditions can be changed depending on the quality and the thickness of the thermal oxide film thus formed (FIG. 8A).

Subsequently, a contact hole 313 in which a take-out electrode which will be formed later is formed in a part of the thermal oxide film 312. The formation of the contact hole may be conducted using the known photolithgraphic technology using a resist. Also, the contact hole is shaped in a long groove backwardly toward the paper surface.

Figure 8B:
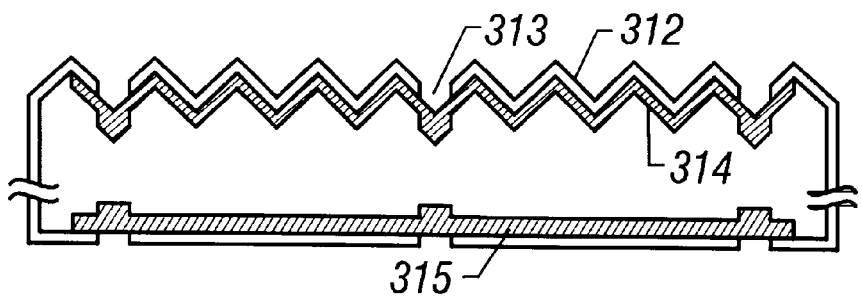

Then, in a state shown in FIG. 8B, p ions that give n-type conductivity are implanted on the front surface side of the silicon substrate 311 to form an n-type conductive region (n⁺ region) 314. Also, B ions that give p-type conductivity are implanted on the back surface side to form a conductive region (p+ region) 315 which is stronger in conductivity type than that of the silicon substrate 311 (FIG. 8B).

In this embodiment, regions except for a region where the contact hole 313 is formed in implanting ions are subjected to through-doping through the thermal oxide film 312. Hence, since the regions into which ions are implanted by through-doping is not directly damaged by ion implantation, there is advantageous in that the center of re-combinations is not formed in the defects and so on in the semiconductor layer.

Also, since the remaining thermal oxide film 312 functions as the reflection preventing film as it is, another reflection preventing film can be omitted although it can be formed separately.

Similarly, in this embodiment, because the thermal oxide film 312 functions as the protective film as in the ninth embodiment, no conductive layer that forms a current path on the side surfaces is formed.

Thereafter, a take-out electrode 316 is formed on the front surface side of the silicon substrate 311, whereas a take-out electrode 317 is formed on the back surface side of the silicon substrate 311. Similarly in this embodiment, both the electrodes 316 and 317 on the front and back surface sides are shaped in sinking comb. Through the above processes, a solar battery structured as shown in FIG. 8C is completed.

Figure 8C:
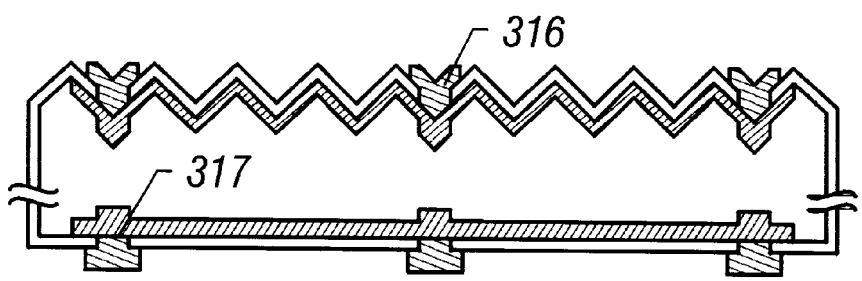

In case of this embodiment, as is apparent from FIG. 8C, it is characterized that a part of the conductive region 314 (or 315) which is in contact with the electrode 316 (or 317) and the remaining part thereof which is out of contact with the electrode 316 (or 317) are different in the distribution of the ion concentration depthwise.

(Eleventh Embodiment)

A eleventh embodiment shows an example in which the materials of the take-out electrodes 307 and 308 formed on the front and back surface sides of the silicon substrate 301 of the ninth embodiment are changed. The basic structure is the same as that in FIG. 7D, and therefore as occasions demand, this embodiment will be described with reference to the reference numerals in FIG. 7D.

Figure 9A:
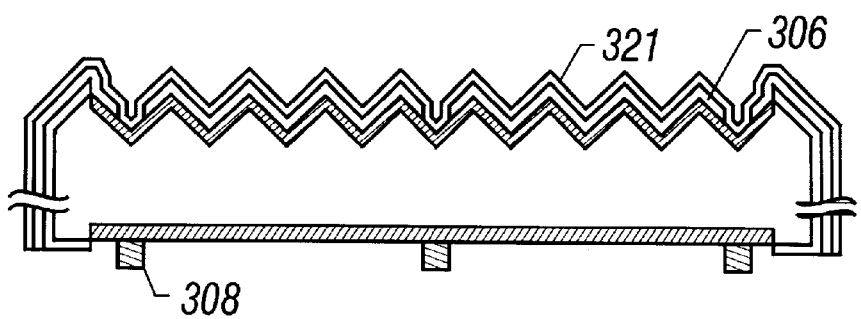
FIGS. 9A and 9B are diagrams for explanation of a process of manufacturing the solar battery in accordance with the eleventh embodiment.

First, FIG. 9A shows an example in which the take-out electrode 307 shown in FIG. 7D is formed of a transparent electrode (for example, oxide compound of indium and tin represented by an ITO film) 321. In this case, the advantage obtained by using the transparent electrode 321 is first that the solar light can be effectively used without being blocked.

Accordingly, as shown in FIG. 9A, the transparent electrode 321 can be formed on the entire surface of the front surface side of the silicon substrate. In other words, the transparent electrode 321 is not required to be patterned, thereby being capable of simplifying the manufacture process.

Also, since the transparent electrode, for example, such as the ITO film functions also as the reflection preventing film, a laminate film consisting of the transparent electrode 321 and the silicon nitride film 306 can be used as the reflection preventing film.

Figure 9B:
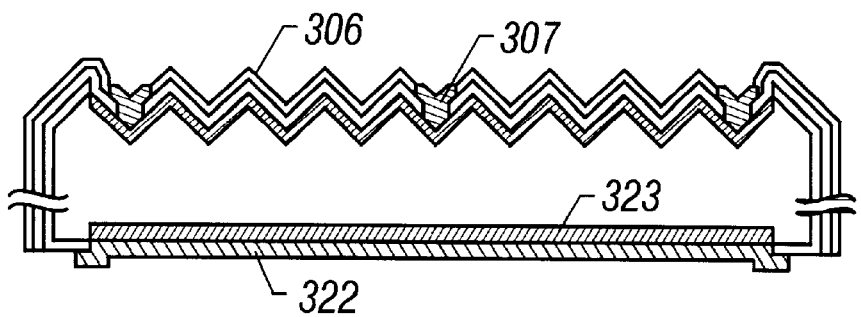

Then, FIG. 9A shows an example in which the take-out electrode 308 shown in FIG. 7D is formed on the entire back surface of the silicon substrate in the ninth embodiment. As shown in FIG. 9B, the advantage obtained by providing the take-out electrode 322 on the entire back surface of the silicon substrate is that the $p^+$ region 323 is not required to be formed through the ion implanting method in the ninth embodiment.

Specifically, using the take-out electrode 322 formed on the entire back surface of the silicon substrate as an impurity diffusing source that gives p-type conductivity, a $p^+$ region 323 can be formed through the solid phase diffusing method. In other words, the recombination of carriers produced can be reduced because the semiconductor layer is not damaged by ion implantation.

Also, when the take-out electrode 322 is made of metal such as Al, Au, Ag, Cu, etc., it can function as a reflection film that allows the solar light which could not be absorbed by the semiconductor layer to be reflected from its back surface side and to be returned again to the semiconductor layer. This is so-called "BSR structure" and effective because it effectively uses the solar light.

(Twelfth Embodiment)

Figure 10A:
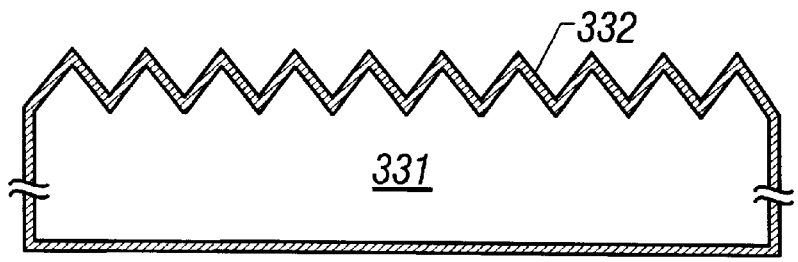
FIGS. 10A to 10D are diagrams for explanation of a process of manufacturing the solar battery in accordance with the twelfth embodiment.

A twelfth embodiment shows an example in which the formation of a current path on the side surfaces of the silicon substrate is prevented through a method different from that described in the ninth to eleventh embodiments. This embodiment will be described with reference to FIGS. 10A to 10D. In FIG. 10A, reference numeral 331 denotes a silicon substrate having a texture structure which is formed through the same process as that in the first embodiment.

In the atmosphere containing P ions that give n-type conductivity to the silicon substrate (p-type) 331, a heat treatment is conducted so that P ions are diffused to form an n-type conductive layer 332. In this embodiment, during the heat treatment, the n-type conductive layer 332 is formed in thickness of 0.3 $\mu$m on all the surfaces (front surface, back surface and side surfaces) of the silicon substrate 331.

Figure 10B:
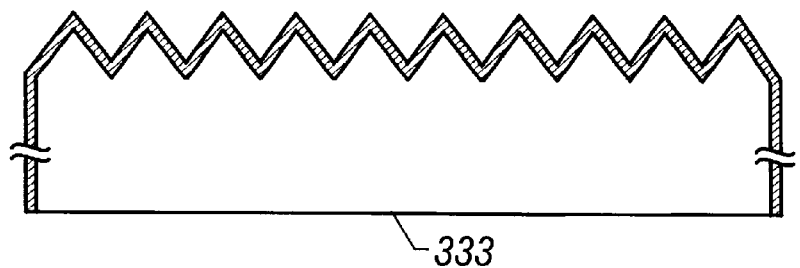

Then, the back surface of the silicon surface 331 is etched and removed about 1 to 10 $\mu$m through the dry etching method or the wet etching method, to thereby obtain a state shown in FIG. 10B. Through this process, an exposed surface 333 is produced on the back surface of the silicon substrate 331.

Also, during the above process, it is preferable that the front surface side of the silicon substrate 331 is protected with a thin oxide film formed, for example, through the UV processing, or the like because contamination can be prevented. It should be noted that such a thin oxide film need be removed later.

After a state shown in FIG. 10B is obtained, the succeeding process is conducted, for example, in accordance with the process described in the ninth embodiment, and a silicon nitride film that functions as a passivation film and a reflection preventing film (of course, it may be a silicon oxide film) 334 is formed.

Subsequently, a $p^+$ region 336 is formed on the back surface side of the silicon substrate 331 as occasions demand. During this process, attention must be paid to that the n-type conductive region 332 and the $p^+$ region 336 should not be in contact with each other in the vicinity of the side surface of the silicon substrate 331. The method of forming the $p^+$ region 336 may be the ion implanting method or the solid phase diffusing method. In this embodiment, the $p^+$ region 336 is formed through the solid phase diffusing method.

Figure 10C:
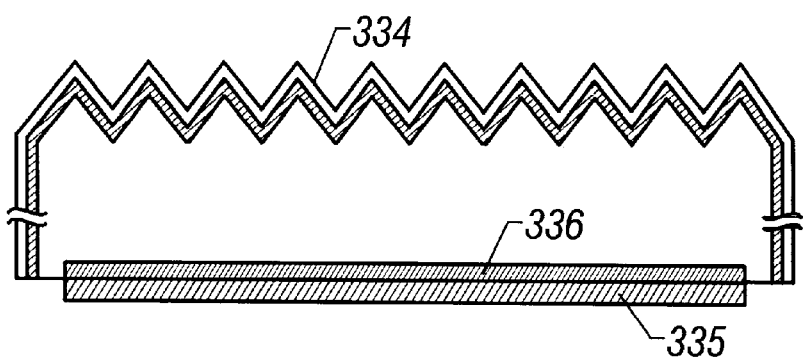

In this case, as shown in FIG. 10C, for example, an Al electrode 335 is formed using the photolithgraphic technology, and Al elements are diffused in the Al electrode 335 through a heat treatment to form a $p^+$ region 336. The reason why the solid phase diffusing method is used is that a distance between the n-type conductive region 332 and the Al electrode 335 can be accurately set because of high patterning accuracy.

Figure 10D:
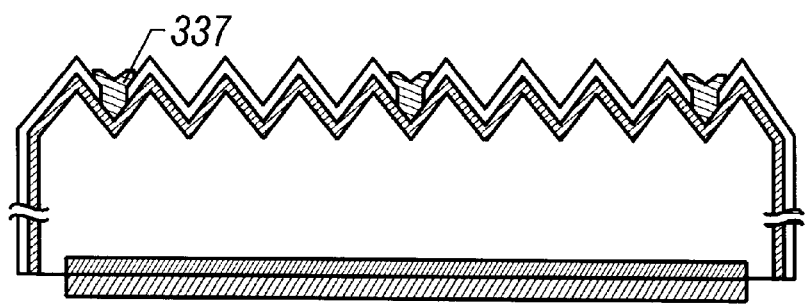

After a state shown in FIG. 10C is obtained, contact holes are formed on necessary portions of the silicon nitride film 334 to form take-out electrodes 337 shaped in sinking comb which are in contact with the front surface side of the silicon substrate 331. Through the above processes, a solar battery structured as shown in FIG. 10D can be manufactured.

(Thirteenth Embodiment)

The first to twelfth embodiments show the bulk type solar battery using the semiconductor substrate. In a thirteenth embodiment, there is shown an example in which a thin film solar battery is manufactured using a semiconductor thin film formed on a quartz substrate, specifically, a crystalline silicon thin film. Although the crystalline silicon thin film can be directly formed through the reduced pressure thermal CVD method or the like, it can be obtained by crystallizing an amorphous silicon thin film in this embodiment. This embodiment will be described with reference to FIGS. 11A to 11E.

First, a silicon oxide film 402 is formed in thickness of 0.3 $\mu$m on a quartz substrate 401 as an under layer. The silicon oxide film is formed through the plasma CVD method with tetramethyl oxide silicon (TEOS) as a raw material, but the sputtering method or the spin coating method can be also used as other methods. Also, an insulating film such as a silicon nitride film may be used.

Thereafter, an amorphous silicon film 403 is formed with silane gas as a raw material through the plasma CVD method. The formation of the amorphous silicon thin film may be conducted through the reduced pressure thermal CVD method, the sputtering method or the vapor deposition method other than the plasma CVD method. Also, the amorphous silicon film may be a substantially intrinsic amorphous silicon thin film or an amorphous silicon thin film to which boron (B) of 0.001 to 0.1 atoms % is added. In this embodiment, the thickness of the amorphous silicon thin film 403 is set to 10 μm. It is needless to say the thickness may be set to a required thickness.

Then, a thin oxide film layer (not shown) is formed on the surface of the amorphous silicon thin film 403. The method of forming the oxide film layer not shown may be a method in which the substrate is immersed in an excess-water ammonia solution and processed at 70° C. for 5 minutes, a method in which the substrate is subjected to a UV process for 5 minutes, or the like. The oxide film layer thus formed (not shown) improves in the wettability of the silicon surface when it is coated with a nickel salt solution containing Ni elements (for example, nickel acetate salt, nickel nitrate salt, etc.,).

Figure 11A:
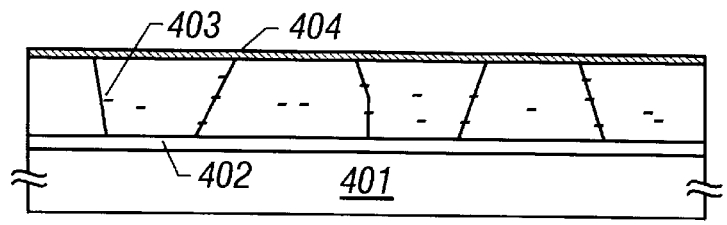
FIGS. 11A to 11E are diagrams for explanation of a process of manufacturing the solar battery in accordance with the thirteenth embodiment.

Subsequently, the nickel salt solution is dropped in the center of the substrate that rotates on a rotary support not shown while spinning, to thereby form a thin water film of nickel salt solution over the entire surface of the substrate. Then, the water film is blown out with an increase of the rotation speed of the spin rotation to form a nickel layer 404. In this manner, a state shown in FIG. 11A is obtained.

Ni elements function also as catalytic elements that promote the crystallization when the amorphous silicon film is crystallized. The effects of promoting the crystallization are disclosed in detail in Japanese Patent Unexamined Publication No. Hei 6-232059 and Japanese Patent Unexamined Publication No. Hei 6-244103 which have been filed by the present applicant. Those publications disclose that metal elements such as Fe, Co, Pt, Cu or Au can be used as other elements.

Then, in the nitrogen atmosphere, the amorphous silicon film is held at a temperature of 450° C. for 1 hour to separate hydrogen in the amorphous silicon film 403. This is because non-bonds are intentionally formed in the amorphous silicon film 403 to lower a threshold value energy for crystallization which will be conducted later.

Then, the amorphous silicon film 403 is subjected to a heat treatment at a temperature ranging from 450 to 700° C., representatively 550 to 650° C., for 4 to 8 hours, to thereby crystallize the amorphous silicon thin film 403, thus obtaining a crystalline silicon thin film 405. The reason why the temperature during crystallization can be set to 550° C. is because of the action of Ni elements.

During the above heat treatment, Ni elements moves in the silicon thin film while promoting the crystalline property to compensate defects within the grains by priority. In particular, the crystalline silicon thin film 405 formed in the above manner has a large number of grain boundaries (represented by lines transverse to the crystalline silicon thin film 405), with the result that Ni elements are segregated on the grain boundaries which are discontinuous from the viewpoint of an energy with a higher concentration than that of other regions. A state in which Ni elements are segregated in the above manner is represented by marks X in FIG. 11B.

Conditions such as the concentration of Ni in the coating solution, the amount of the coating solution, etc., are adjusted so that the amount of Ni elements introduced in the crystalline silicon thin film 405 is set to $1\times10^{19}$ to $1\times10^{20}/cm^3$. If it is less than that concentration, Ni elements are not efficiently segregated to the defects to make it difficult to obtain the effect of the present invention. Also, when it is more than that concentration, gettering at a post-stage is difficult to conduct, which is not preferable.

Figure 11B:
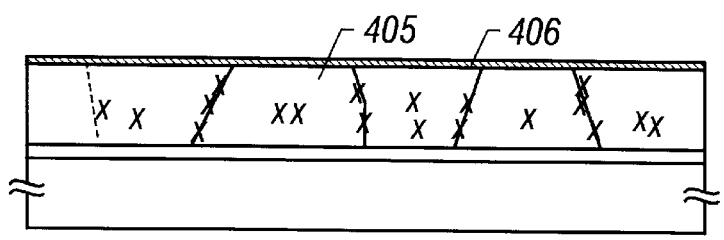

Nickel silicide formed in the defects comes to a combination state excellent in matching because its lattice constant approaches the lattice constant of silicon. Also, the Ni layer 404 reacts with the crystalline silicon thin film 405 which is in contact with the Ni layer 404 SO that it is changed into a nickel silicide layer 406 containing Ni elements with a high concentration (FIG. 11B).

The significant feature of the present invention resides in that Ni elements which are catalytic elements are intentionally segregated to the defects for the reason that the defects which were in an irregular bond state come to the bond state excellent in matching. This is important in a post-process of gettering Ni elements by halogen elements.

Thereafter, an etching process is conducted by a hydrofluoric acid solution or the like to remove the nickel silicide layer 406. This is because the nickel silicide layer 406 is disadvantageous in a post-process of removing Ni elements by gettering since the nickel silicide film 406 contains Ni elements with a high concentration.

Then, in the atmosphere containing halogen elements, a heat treatment is conducted at a temperature ranging from 700 to 1100° C., representatively, 800 to 950° C. In this embodiment, the heat treatment is conducted at 950° C. for 30 min in the oxidizing atmosphere with which HCl (hydrogen chloride) of 0.1 to 10 wt %, representatively 3 wt % with respect to oxygen is mixed. Through the heat treatment, Ni elements that have compensated the defects inside of the crystalline silicon thin film 405 are gettered by Cl elements and separated from the crystalline silicon thin film 405.

Ni elements that have been gettered by Cl elements are changed into nickel chloride which is a volatile gas and then diffused in an air, or taken in the interior of the thermal oxide film 408 formed on the surface of the crystalline silicon thin film 407, thus removing Ni elements from the interior of the crystalline silicon thin film 407. A state where Ni elements are gettered in this manner is represented by marks "X" in FIG. 11C.

Hence, the concentration of Ni elements that remains inside of the crystalline silicon thin film 405 becomes very low, and is reduced to 1/10 to 1/1000 of the original one after being processed. Specifically, it can be set to $5\times10^{18}/cm^3$ or less, preferably $5\times10^{16}/cm^3$ or less.

The state in which Ni elements of $5\times10^{18}/cm^3$ or more are contained is not preferable because the characteristic of metal is remarkably exhibited in the semiconductor. In other words, with a reduction of the concentration of Ni to $5\times10^{18}/cm^3$ or less, preferably $5\times10^{16}/cm^3$ or less by gettering, the crystalline silicon thin film which does not functionally adversely affect the function as the solar battery can be obtained.

Furthermore, because the non-bonds of Si that remain after Ni elements have been separated approach each other and also are in an active state, Si—Si bonds are formed during the heat treatment so that the crystalline property excellent in matching is realized. In other words, the defects are substantially removed.

Also, since the same phenomenon is developed on the grain boundaries, the energy barrier of the grain boundaries is extremely lowered, or comes to a state where it is regarded that no grain boundaries substantially exists. It should be noted that in this embodiment, in order to show that state, the grain boundaries after having being thermally oxidized is indicated by a dotted line.

Attention should be paid to the point that this process is not conducted only for the purpose of gettering Ni elements. Although the gettering process per se is well known, the object of the present invention is not achieved without the combination of the introduction of Ni elements, the gettering of Ni elements by halogen elements, and the removal (re-combination) of the defects which is conducted simultaneously while gettering as described above.

Figure 11C:
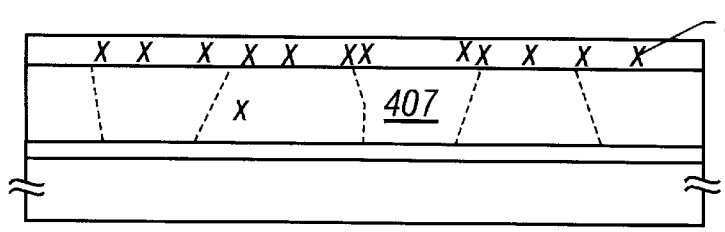

Also, as shown in FIG. 11C, the crystalline silicon thin film 405 is formed into the crystalline silicon thin film 407 which is extremely low in the concentration of Ni and whose defects are substantially eliminated. Also, on the surface of the crystalline silicon thin film 407 is formed a thermal oxide film 408 containing nickel with a high concentration. Since this state causes reverse diffusion due to the thermal oxide film 407 containing Ni elements with a relatively high concentration, the thermal oxide film 408 is etched and removed by a hydrofluoric acid solution or the like, to thereby expose the crystalline silicon thin film 407.

Moreover, it is preferable that the surface layer of the crystalline silicon thin film 407 is removed by several hundreds Å through the dry etching method or the wet etching method using hydrazine or sodium hydroxide because Ni elements that have been segregated on the boundary between the crystalline silicon thin film 407 and the thermal oxide film 408 can be also removed.

Figure 11D:
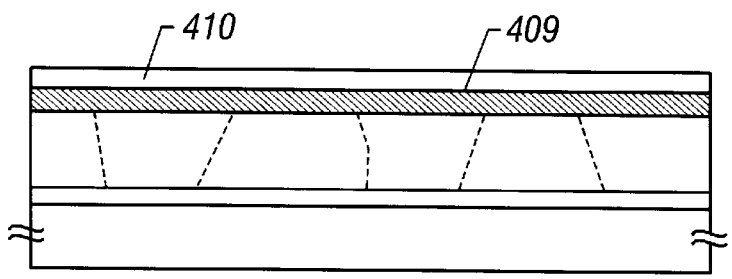

Then, as shown in FIG. 11D, a crystalline silicon thin film 409 having n-type conductivity on the surface of the crystalline silicon thin film 407 through the reduced pressure thermal CVD method. Also, the thickness of the crystalline silicon thin film 409 is set to 0.01 to 0.5 $\mu$m. In this embodiment, it is set to 0.1 $\mu$m. Since the crystalline silicon thin film directly formed is normally not so high in crystalline property, the crystalline property is required to be improved through the thermal annealing using the laser annealing, the lamp annealing or the like.

Alternatively, a heat treatment may be conducted on the crystalline silicon thin film in such a manner that the crystalline silicon thin film 409 having n-type conductivity also functions as gettering sink, with the result that the concentration of nickel within the crystalline silicon thin film 407 can be reduced more by the gettering action of chlorine and the gettering action of phosphorus.

The crystalline silicon thin film 409 having n-type conductivity may be used in a microcrystal state. Also, although in this embodiment, the crystalline silicon thin film is used, an amorphous silicon thin film may be used depending on the conditions.

Subsequently, a transparent electrode 410 is formed in the thickness of 0.1 $\mu$m on an n-type crystalline silicon film 409 by an alloy of indium oxide and tin (ITO) using the sputtering method. The transparent electrode 410 functions as a reflection preventing film. It should be noted that the reflection preventing film may be made of various materials such as a silicon oxide film, a silicon nitride film, a titanium oxide film, a magnesium fluoride film, a tin oxide film, a tantalum oxide film, a cerium oxide film or an aluminum oxide film other than ITO (FIG. 11D).

Figure 11E:
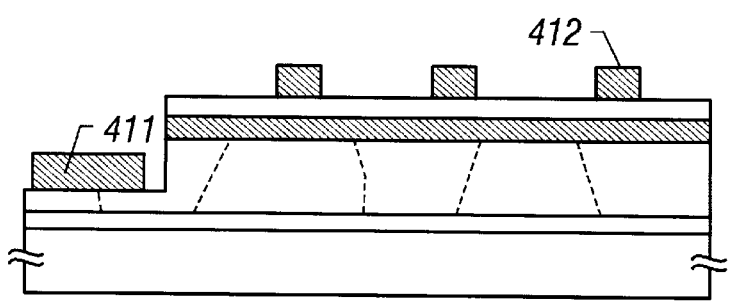

Finally, a process of providing take-out electrodes is conducted. In providing the take-out electrodes, as shown in FIG. 11E, a part of the transparent electrode 410, the n-type crystalline silicon 409, and the crystalline silicon thin film 407 is removed. Then, an electrode 411 on a plus side which is connected to the crystalline silicon thin film 407 is provided. An electrode 412 on a minus side which is connected to the transparent electrode 410 is formed.

Subsequently, take-out electrodes 411 and 412 can be made of aluminum, silver, silver past or the like which is formed through the sputtering method or the vapor deposition method. Further, if a heat treatment is conducted at 150 to 300° C. for several minutes after the provision of the electrodes, the adhesion to the under film is improved to obtain an excellent electric characteristic. In this embodiment, the heat treatment is conducted at 200° C. for 30 minutes in the nitrogen atmosphere, using an oven.

In this embodiment, the electrode 412 on the minus side is structured in the form of a sinking comb in order to restrain a light shield area as much as possible. In other words, a cross section of a tooth portion of the sinking comb looks like that shown in FIG. 11E. Hence, although three electrodes 412 appears in the figure, all of them are in fact electrically connected to each other.

Through the above processes, a thin film solar battery shown in FIG. 11E can be completed. Since the defects and the grain boundaries which form the center of the re-combination of carriers produced are extremely reduced in the crystalline silicon thin film, the solar battery can achieve a sufficient conversion efficiency with a thicker thickness even though the crystalline silicon thin film is small in the coefficient of absorption.

(Fourteenth Embodiment)

In the thirteenth embodiment, the heat treatment is conducted in the atmosphere containing HCl gas, and the catalytic elements are gettered by halogen elements (Cl elements in the first embodiment). However, for example, a fluorine gas such as $NF_3$ or $ClF_3$ may be used instead.

The feature of the fluorine gas resides in that a thermal oxide film can be formed and the gettering effects can be obtained at a temperature lower than that of HCl gas, particularly, at a temperature of about 500 to 700° C. This fact means that an inexpensive gas substrate can be used as a substrate, and is very effective in reducing the manufacture costs. Also, for example, a solar battery can be formed on a thin stainless steel substrate having flexibility to form a flexible solar battery.

Further, that the gettering effect is obtained with the amount of fluorine gas introduced less than that of HCl gas is greatly advantageous in reducing the manufacture costs. In fact, if the fluorine gas is introduced about 1/10 of HCl, the sufficient effects can be expected.

In this embodiment, a wet oxidizing process is conducted at a temperature ranging from 500 to 600° C. for 30 to 60 minutes in the atmosphere where hydrogen of 3 wt % and $NF_3$ gas of 50 to 200 ppm with respect to oxygen are mixed. However, since the processing temperature is lower than that in the first embodiment, the recombination of Si with Si after Ni elements have been gettered is not good. However, in this case, the secondary effect that the non-bonds are terminated by fluorine during the gettering process can be expected. In other words, the non-bonds which could not be recombined during the heat treatment are terminated by fluorine, to thereby enable deactivation. In this case, since Si—F bond is stronger than Si—H bond in bonding force, it is effective in improving the crystalline property.

Although the heat treatment using the $NF_3$ gas is originally to getter the catalytic elements as described above, the terminal effect of the non-bonds and the effect of reducing the manufacture costs are additionally obtained, with the result that it is effective in a case where the solar battery is manufactured using a semiconductor layer having grain boundaries such as a crystalline silicon thin film as in this embodiment.

The oxidizing atmosphere containing fluorine may be atmosphere that satisfies the following conditions (1) and (2).

(1) Atmosphere in which HCl of 1 to 5 wt % and $NF_3$ of 10 to 200 ppm are contained with respect to oxygen.

(2) Atmosphere in which hydrogen of 3 wt % and CLF$_3$ of 50 to 100 ppm are contained with respect to oxygen.

In particular, in the atmosphere that satisfies the condition (2), the gettering effect of both Cl elements and F elements can be expected.

(Fifteenth Embodiment)

In the thirteenth and fourteenth embodiments, there is exemplified that chlorine and fluorine which are halogen elements are used as the gettering elements. A fifteenth embodiment shows an example in which phosphorus that belongs to elements of group XV is used as the gettering elements.

Figure 12A:
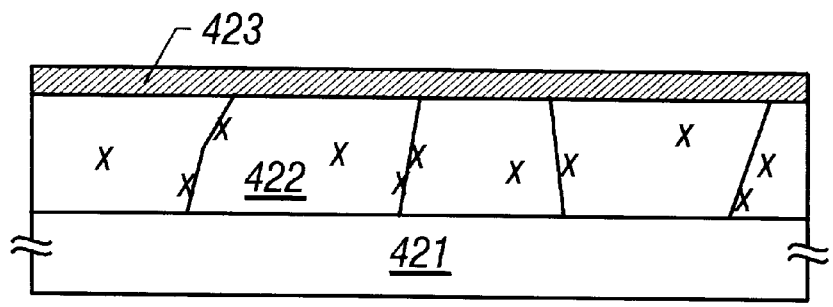
FIGS. 12A to 12C are diagrams for explanation of a process of improving a crystalline property in accordance with a sixteenth embodiment.

This embodiment will be described with reference to FIGS. 12A to 12C.

First, as in the thirteenth embodiment, a silicon oxide film not shown is formed in thickness of 0.3 $\mu$m as an under film on a quartz substrate 421 through the plasma CVD method. Then, an amorphous silicon film is formed in thickness of 10 $\mu$m with a silane gas as a raw material through the plasma CVD method, and as in the first embodiment, the amorphous silicon film is crystallized using Ni elements to form a crystalline silicon thin film 422.

Conditions such as the concentration of Ni in the coating solution, the amount of the coating solution, etc., are adjusted so that the amount of Ni elements introduced in the crystalline silicon thin film 422 is set to $1\times10^{19}$ to $1\times10^{20}/$cm$^3$. Also, Ni elements are segregated on the grain boundaries in the crystalline silicon thin film with a higher concentration than that in other regions. A state in which Ni elements are segregated in this manner is represented by marks X in FIG. 12A.

Conditions such as the concentration of Ni in the coating solution, the amount of the coating solution, etc., are adjusted so that the amount of Ni elements introduced in the crystalline silicon thin film 422 is set to $1\times10^{19}$ to $1\times10^{20}/$cm$^3$. If it is less than that concentration, Ni elements are not efficiently segregated to the defects to make it difficult to obtain the effect of the present invention. Also, when it is more than that concentration, gettering at a post-stage is difficult to conduct, which is not preferable.

Nickel silicide formed in the defects comes to a combination state excellent in matching because its lattice constant approaches the lattice constant of silicon.

Then, a PSG film 423 is formed on a surface of the crystalline silicon thin film 422 as the layer containing phosphorus. The PSG film 423 is formed through the atmospheric pressure CVD method with silane, phosphine and oxygen as a raw material. It is important that the concentration of phosphorus within the PSG film 423 is set to be higher at least by one digit than the concentration of nickel within the crystalline silicon thin film 422. For example, if the concentration of nickel within the crystalline silicon thin film 422 in which nickel was segregated is approximately $1\times10^{19}/$cm$^3$, then the concentration of phosphorus within the PSG film 423 is set to be $1\times10^{20}/$cm$^3$ or more.

Then, as shown in FIG. 12D, a heat treatment is conducted at 500 to 650° C. for several hours for gettering. In this embodiment, the heat treatment was conducted at a heat temperature of 600° C. for 8 hours within an electric furnace which is in the nitrogen atmosphere. Through the heat treatment, Ni elements which have compensated the defects diffused inside of the crystalline silicon thin film 422 are gettered by phosphorus inside of the PSG film 423 so as to be removed from the crystalline silicon thin film 422.

Hence, the concentration of Ni elements that remains inside of the crystalline silicon thin film 422 becomes very low, and is reduced to $\frac{1}{10}$ to $\frac{1}{1000}$ of the original one after being processed. Specifically, it can be set to $5\times10^{18}/$cm$^3$ or less, preferably $5\times10^{16}/$cm$^3$ or less. The state in which Ni elements of $5\times10^{18}/$cm$^3$ or more are contained is not preferable because the metal characteristic is remarkably exhibited in the semiconductor. In other words, with a reduction of the concentration of Ni to $5\times10^{18}/$cm$^3$ or less, preferably $5\times10^{16}/$cm$^3$ or less by gettering, a crystalline silicon thin film which dose not adversely affect the function as the solar battery can be obtained.

Furthermore, because the non-bonds of Si which has remained after Ni elements have been separated approach each other and also are in an active state, Si—Si bonds are formed during the heat treatment so that the crystalline property excellent in matching is realized. In other words, the defects are substantially removed.

Figure 12B:
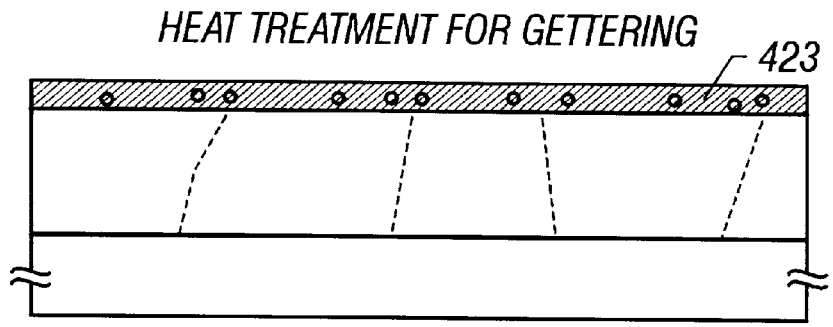
Figure 12C:
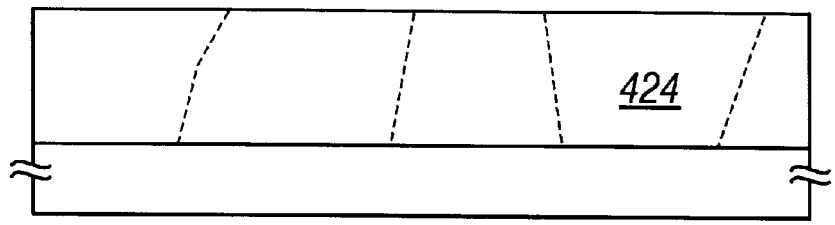

Thus, a state shown in FIG. 12B is obtained. Since this state causes reverse diffusion due to the PSG film 423 containing Ni elements with a relatively high concentration, the PSG film 423 is etched and removed by a hydrofluoric acid solution or the like, thereby being capable of obtaining a crystalline silicon thin film 424 the crystalline property of which has been improved as shown in FIG. 12C.

Moreover, it is preferable that the surface layer of the crystalline silicon thin film 424 is removed by about 0.1 to 1 $\mu$m through the dry etching method or the wet etching method using hydrazine or sodium hydroxide because Ni elements that have been segregated on the boundary between the crystalline silicon thin film 424 and the PSG film 423 can be also removed.

In this embodiment, since the crystalline silicon thin film 424 is reduced in the defects inside thereof as much as possible by the gettering action of phosphorus, it has crystalline property to the same degree as that of a so-called monocrystal silicon substrate.

Using the crystalline silicon thin film 424 thus formed for a photoelectric conversion device, for example, the solar battery described in the thirteenth embodiment can be manufactured.

(Sixteenth Embodiment)

The fifteenth embodiment shows the example in which the PSG film is formed as the gettering sink through the gas phase method, but a layer containing other phosphorus can be used.

For example, a coat containing phosphorus can be formed using the liquid layer method. That is, an organic silicide solution to which phosphorus is added is coated on the surface of the crystalline silicon thin film through the spin coating method, and thereafter baked to form a silicon oxide film to which phosphorus is added.

Also, it can be formed by an amorphous or polycrystal silicon film to which phosphorus is added through the gas phase method. A phosphorus added layer may be formed in such a manner that phosphorus ions are implanted on the surface of the crystalline silicon thin film through the ion implanting method or the plasma doping method.

It is preferable that the gettering film is large in the selection ratio of etching to the semiconductor substrate because it is etched and removed after the gettering process. Hence, in the case where the phosphorus added silicon film is used as the gettering film, attention must be paid to the removal of the gettering film.

As a method of facilitating the etching of the phosphorus added silicon film, there is a method in which the phosphorus added silicon film is oxidized in the heating process for gettering. As a result, only the silicon film oxidized can be selectively removed. In order to oxidize silicon, the heat treatment atmosphere may be the oxidizing atmosphere. For example, it may be the mixed gas atmosphere consisting of nitrogen (partial pressure ratio 89%), oxygen (partial pressure ratio 10%) and hydrogen chloride (partial pressure ratio 1%).

Alternatively, a heat time and a heat temperature are controlled to oxidize the silicon film.

(Seventeenth Embodiment)

A seventeenth embodiment shows a method of forming gettering sink by selectively adding phosphorus ions to a crystalline silicon thin film with reference to FIGS. 13A to 13E.

First, a silicon oxide film 432 is formed in thickness of 0.3 μm on a quartz substrate 431 as an undercoat film through the plasma CVD method. Then, an amorphous silicon film is formed in thickness of 10 μm with silane gas as a raw material through the plasma CVD method, and as in the first embodiment, the amorphous silicon film is crystallized using Ni elements to form a crystalline silicon thin film 433.

Conditions such as the concentration of Ni in the coating solution, the amount of the coating solution, etc., are adjusted so that the amount of Ni elements introduced in the crystalline silicon thin film 433 is set to $1\times10^{19}$ to $1\times10^{20}/cm^3$. Also, Ni elements are segregated on the grain boundaries in the crystalline silicon thin film 433 with a higher concentration than that in other regions, compensating non-bonds. A state in which Ni elements are segregated in this manner is represented by marks "X" in FIG. 13A.

Figure 13A:
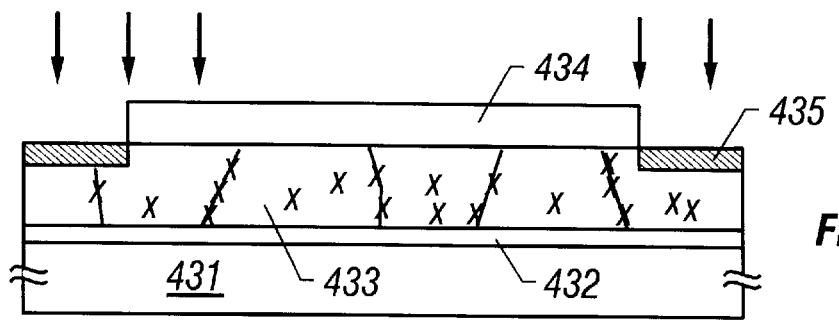
FIGS. 13A to 13E are diagrams for explanation of a process of improving a crystalline property in accordance with a seventeenth embodiment.
Figure 13B:
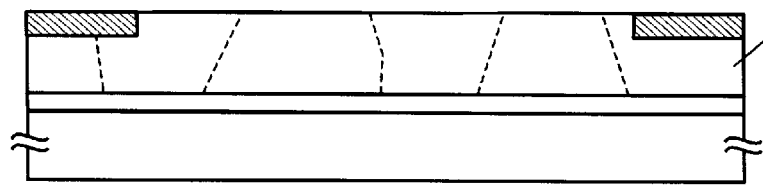

Subsequently, as shown in FIG. 13B, a mask 434 formed of a silicon oxide film is formed on the crystalline silicon thin film 433. Then, phosphorus ions are selectively introduced into the crystalline silicon thin film 433 through the plasma doping method and the ion implanting method to form a phosphorus added region 435.

After the removal of the mask film, a heat treatment is conducted at 600° C. for 8 hours in the mixed gas atmosphere consisting of nitrogen, oxygen and chlorine. Through the heat treatment, Ni elements which have compensated the defects diffused inside of the crystalline silicon thin film 433 are gettered by phosphorus inside of the phosphorus added region 435 so as to be separated from the crystalline silicon thin film 433.

Hence, the concentration of Ni elements that remains inside of the crystalline silicon thin film 433 becomes very low, and is reduced to ⅒ to ⅟₁₀₀₀ of the original one after being processed.

Specifically, it can be set to $5\times10^{18}/cm^3$ or less, preferably $5\times10^{16}/cm^3$ or less.

Also, because with the separation of Ni, the non-bonds of Si on the grain boundaries form Si—Si bonds, the grain boundaries are substantially removed.

In this embodiment, the object of the present invention is not achieved without the combination of the introduction of Ni elements, the gettering of Ni elements by phosphorus, and the removal (recombination) of the defects which is conducted simultaneously while gettering.

Figure 13C:
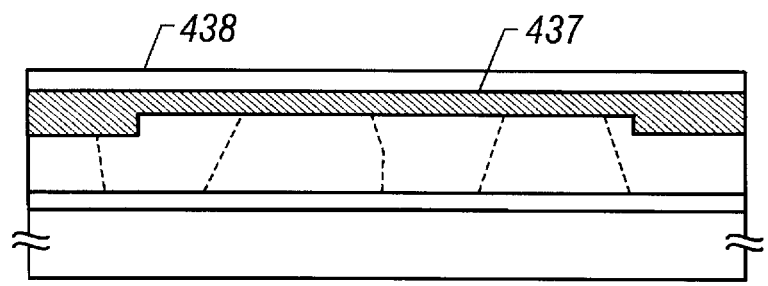

Through the above process, the crystalline silicon thin film 433 is changed into a crystalline silicon thin film 436 which is very low in the concentration of Ni elements and whose defects are substantially removed (FIG. 13C).

Also, since the surfaces of the crystalline silicon thin film 436 and the phosphorus added region 435 are oxidized to form a thin oxide film, the thermal oxide film is etched and removed by a hydrofluoric acid solution or the like.

Then, as shown in FIG. 13C, a crystalline silicon film 437 having n-type conductivity is formed in the thickness of 0.1 μm on the surface of the crystalline silicon thin film 436 through the reduced pressure CVD method. Subsequently, a transparent electrode 438 is formed on the n-type crystalline silicon film 437. The transparent electrode 438 is formed in thickness of 0.1 μm by an alloy of indium oxide and tin (ITO) using the sputtering method.

Figure 13D:
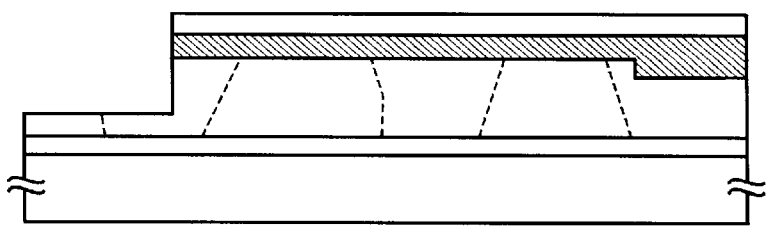

Finally, a process of providing take-out electrodes is conducted. In providing the take-out electrodes, as shown in FIG. 13D, parts of the surface layers of the transparent electrode 438, the n-type crystalline silicon 437, and the crystalline silicon thin film 436 are first removed.

Figure 13E:
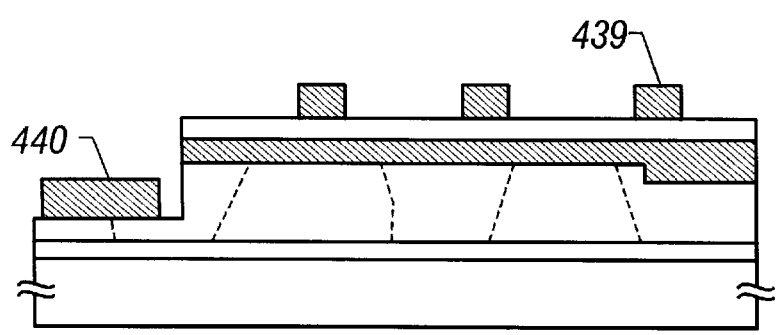

Subsequently, as shown in FIG. 13E, an electrode 439 on the minus side which is connected to the transparent electrode 438 and an electrode 440 on the plus side which is connected to the crystalline silicon thin film 436 are provided using aluminum, silver, silver paste or the like which is formed through the sputtering method or the vapor deposition method. In this embodiment, the n-type conductive region is made up of not only the crystalline silicon thin film 437 having n-type conductivity but also a part of the phosphorus added region 435. However, in the case where there is a fear of a problem on the reliability or the like because the phosphorus added region 435 contains nickel with a relatively high concentration, the entire phosphorus added region 435 may be removed. For example, the phosphorus added region 435 may be formed on only a portion from which the crystalline silicon thin film 436 shown in FIG. 13D is removed. Alternatively, in the case of structuring the solar battery such that the crystalline silicon thin film 436 is divided, the phosphorus added region 435 may be formed on only the divided portion.

(Eighteenth Embodiment)

When a texture structure is formed on the surface of the crystalline silicon thin film obtained in the thirteenth embodiment, the efficiency of absorption of the solar light is improved, thereby being capable of enhancing the photoelectric conversion factor. This is because a solar light is scattered by an uneven portion (texture) formed on the surface of the crystalline silicon thin film to make an optical path length longer, thereby being capable of efficiently absorbing the solar light. In this embodiment, the texture structure is formed through the following technique.

In this embodiment, there is applied a method of conducting a texture processing by heating 2% NaOH aqueous solution at 80° C. and etching the surface layer of the crystalline silicon thin film. The etching is conducted for 5 minutes, and thereafter the crystalline silicon thin film is immersed in a boiling water in order to instantly stop reaction, and sufficiently cleaned with a pure water. According to the observation of the surface of the crystalline silicon thin film through an electron microscope, roughness of about 0.1 to 5 μm has been observed although it was irregular.

In the solar battery using monocrystal silicon, (100) face is alkali-etched so that only (111) face is selectively etched to form the texture of a pyramid structure. In the case of using the crystalline silicon thin film (for example, polycrystal, microcrystal) as in this embodiment, the texture structure is irregular because its orientation is irregular.

Accordingly, in order to sufficiently exhibit the effects of the texture structure, it is effective that the texture process is conducted in combination of patterning, and it is effective that the pattern structure (texture structure) is positively controlled.

Figure 14A:
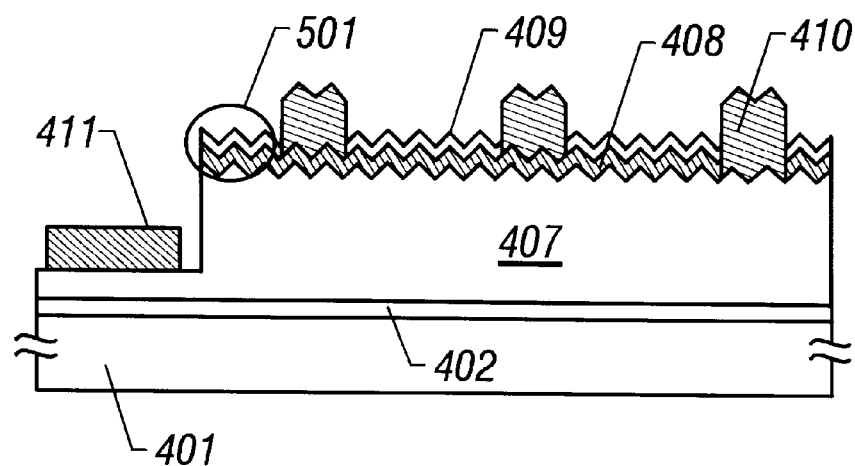
FIGS. 14A and 14B are diagrams for explanation of a process of manufacturing the solar battery in accordance with the eighteenth embodiment.

A cross-section of the solar battery having the texture structure of this type is shown in FIG. 14A. Since the structure is almost identical with that of the thin film solar battery which is described in FIGS. 11A to 11E, the same parts are represented by like references used in FIGS. 11A to 11E.

In FIG. 14A, an undercoat film 402 is formed on a quartz substrate 401, on which a crystalline silicon thin film 405 which has been subjected to nickel introduction and a gettering process as described in the thirteenth embodiment is formed. A main surface of a crystalline silicon thin film 407 is etched through the texture process to form a texture having an uneven shape as indicated by reference numeral 501. Then, an n-type conductive layer 409, a transparent conductive film 410 and electrodes 410 and 411 are formed, thereby being capable of constituting a solar battery shown in FIG. 14A.

Figure 14B:
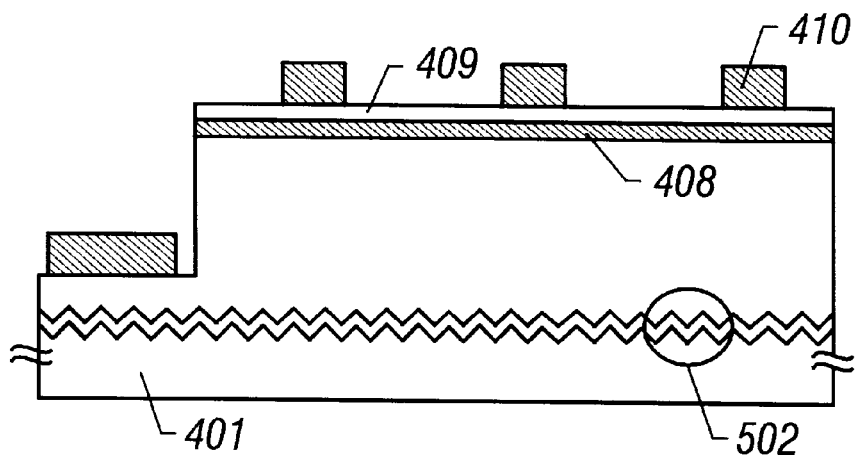

Likewise, the texture process is conducted on the substrate, thereby being capable of forming the texture on the substrate surface. The sectional structure of the solar battery in this case is shown in FIG. 14B. In this case, as indicated by reference numeral 502, the surface layer of the substrate 401 is chemically etched or physically etched by sand blast or the like to form a texture structure. In the method shown in FIG. 14A, the thickness of the crystalline silicon thin film is reduced whereas in the method shown in FIG. 14B, the texture structure is obtained without any change of the thickness.

Since the texture structure enables the solar light to be efficiently utilized, it is a very effective technique for the solar battery using the crystalline silicon thin film small in the coefficient of absorption. Hence, the solar battery shown in FIG. 14 together with the texture structure according to the present invention provides a very high conversion factor.

(Nineteenth Embodiment)

Figure 15A:
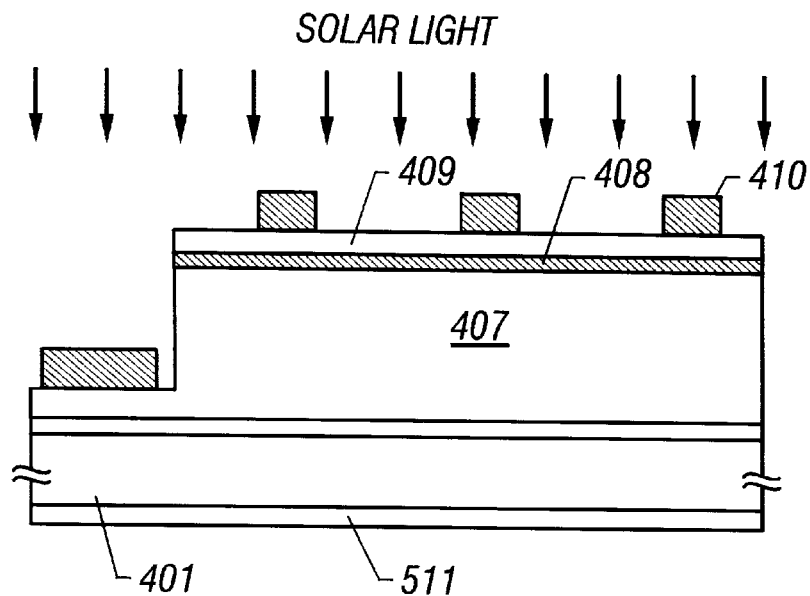
FIGS. 15A and 15B are diagrams for explanation of a process of manufacturing the solar battery in accordance with the nineteenth embodiment.

The solar battery described in the thirteenth embodiment is to utilize the solar battery incident from the upper surface in FIG. 11D. Hence, as shown in FIG. 15A, when a thin film 511 having a light shield property such as an aluminum film or a titanium film is formed on the back surface of the substrate 401, the solar light that has passed through the semiconductor layer 407 and 408 without being absorbed is reflected by the thin film 511 and reused, thus being capable of improving the efficiency of absorption of the solar light.

Figure 15B:
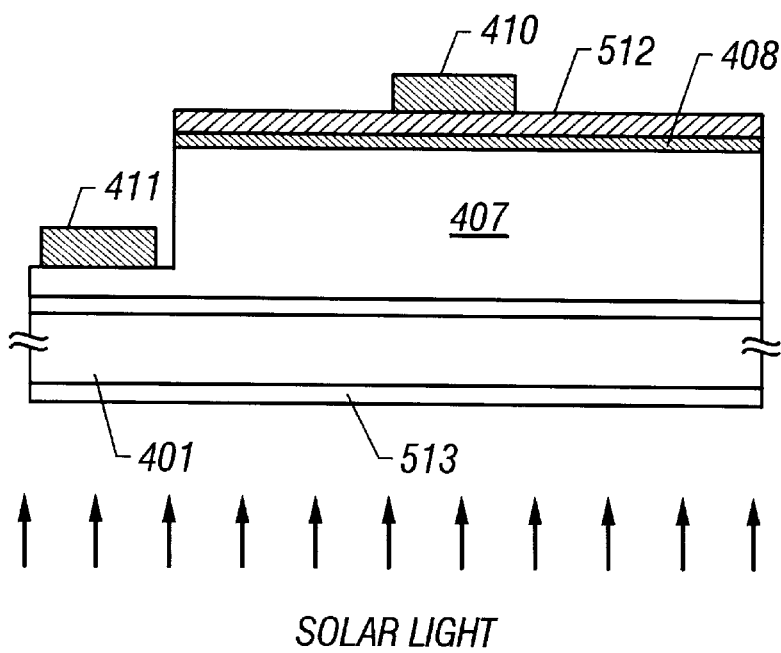

Also, in the case of using a translucent substrate (a quartz substrate in this example) as the substrate 401 as in the thirteenth embodiment, the solar light entering from the back surface side of the substrate 401 can be used. In this case, as shown in FIG. 15B, the thin film 512 having the light shield property is used instead of transparent conductive film 409 shown in FIG. 11D, thereby being capable of effectively utilizing the solar light.

In this example, it is desirable that in order to prevent the solar light from being reflected on the back surface side of the substrate 401, a silicon oxide film, a silicon nitride film, or the like is formed as the reflection preventing film 513.

Also, it is effective that this embodiment is applied together with the texture structure described in the third embodiment because the coefficient of absorption of the solar light is improved. In particular, this is very effective technique for the case where, like this embodiment, the crystalline silicon thin film small in the coefficient of absorption is used for a photoelectric conversion layer.

(Twentieth Embodiment)

This embodiment shows an example of forming a crystalline silicon thin film having n-type conductivity according to a method different from that in the thirteenth embodiment. Specifically, in FIG. 11D, imparting elements that give n-type conductivity to the main surface of the crystalline silicon thin film are added.

Figure 16A:
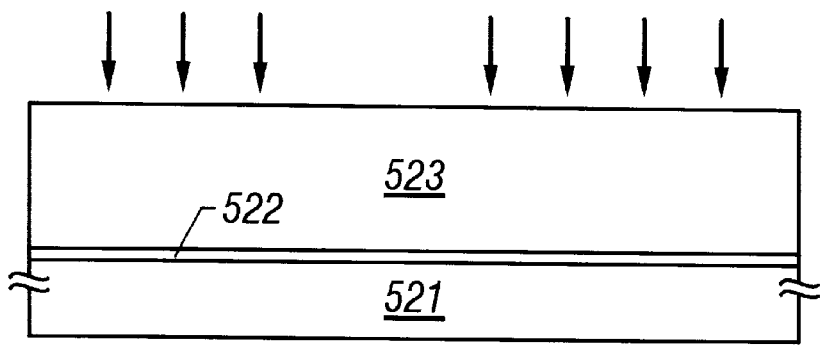
FIGS. 16A to 16C are diagrams for explanation of a process of manufacturing the solar battery in accordance with the twentieth embodiment.
Figure 16B:
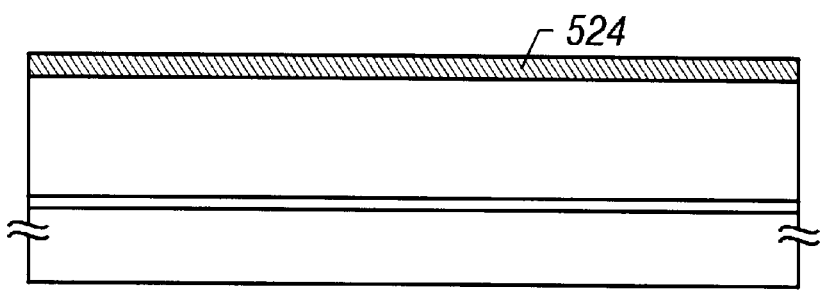

FIG. 16A shows a state in which the crystalline silicon thin film is formed through the nickel introducing process and the gettering process as described in the thirteenth and seventeenth embodiments, which is made up of a substrate 521, an under film 522 and a crystalline silicon thin film 523. In this state, P (phosphorus) is added as the impurity elements that give n-type conductivity through the ion implanting method and the plasma doping method. In this way, an n-type conductive layer 524 shown in FIG. 16B is formed.

Also, the amount of the impurity elements added is adjusted such that a depth (joint depth) from the main surface of the n-type conductive layer 524 is set to 0.01 to 0.5 $\mu$m. Since the n-type conductive layer 524 functions only to collect carriers and send them to the electrodes, the joint depth is made as shallow as possible to reduce the possibility of re-combining the carriers.

Further, it is desirable that the n-type conductive layer 524 thus formed is activated through the laser annealing, the lamp annealing or the like. The activation also provides the effect of restoring the crystalline property which has been damaged by the ion implantation or the like. It is very effective that the surface (an upper surface side in FIG. 16B) of the n-type conductive layer 524 which is particularly liable to be damaged is chemically etched and removed.

After the n-type conductive layer 524 is formed as described above, a reflection preventing film 525 is formed on the n-type conductive layer 514. In this embodiment, a silicon oxide film 1000 Å in thickness is used as the reflection preventing film.

Figure 16C:
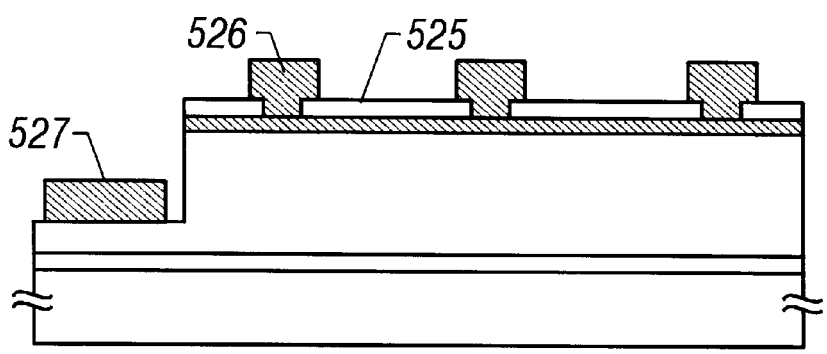

After the reflection preventing film 525 is formed, the formation of contact holes and the etching of the crystalline silicon thin film are conducted to form take-out electrodes 526 and 527, with the result that a solar battery structured as shown in FIG. 16C is completed.

After the reflection preventing film 525 is formed on the crystalline silicon thin film 523, impurity elements can be added through the through-doping. With this structure, a damage on the in surface of the crystalline silicon thin film 523 (accurately, the n-type conductive layer 524) can be restrained, thereby being capable of reducing the defects that form the center of re-combination.

(Twenty-first Embodiment)

Figure 17A:
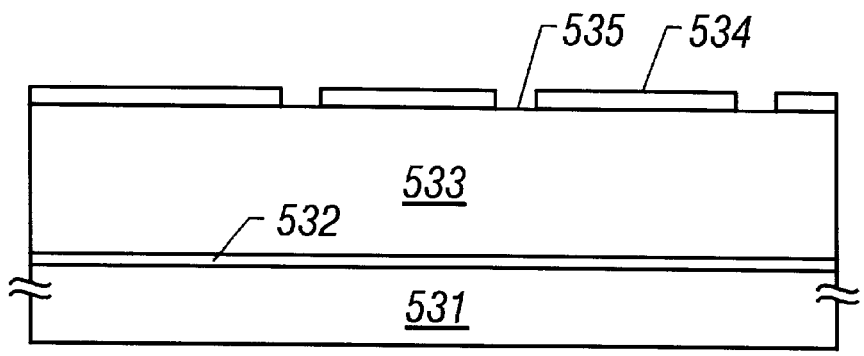
FIGS. 17A to 17C are diagrams for explanation of a process of manufacturing the solar battery in accordance with the 21st embodiment.

This embodiment shows an example of another structure of the solar battery in accordance with the present invention. First, a crystalline silicon thin film is obtained in accordance with the thirteenth embodiment of the present invention. In FIG. 17A, reference numeral 531 denotes an alumina substrate; 532, an under film that is formed of a silicon oxide film; and 533, a crystalline silicon thin film obtained in accordance with the present invention.

Also, silicon nitride film 534 is formed on the crystalline silicon thin film 533 as a reflection preventing film, and contact holes 535 are formed on at least a part of the silicon nitride film 534. The contact holes 535 are formed to form take-out electrodes later (FIG. 17A).

After a state shown in FIG. 17A is thus obtained, P ions that give n-type conductivity are added as impurity elements through the ion implanting (ion doping) method in this state. In other words, in this case, P ions are added to a region surrounded by the silicon nitride film by through-doping, and P ions are added directly to regions which are exposed by the contact holes 535.

Figure 17B:
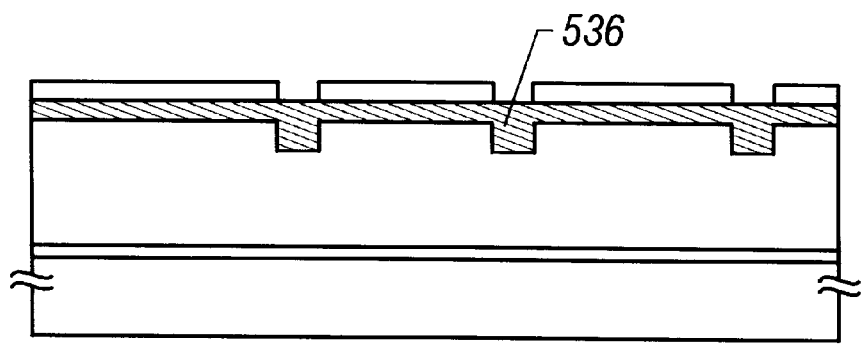

Therefore, the n-type conductive layer 536 formed by addition of P ions is shaped as shown in FIG. 17B. In other words, the n-type conductive region 536 has regions which are different in the distribution of ion concentration depthwise viewed from the main surface of the crystalline silicon thin film 533 (strictly, the n-type conductive layer 536).

Figure 17C:
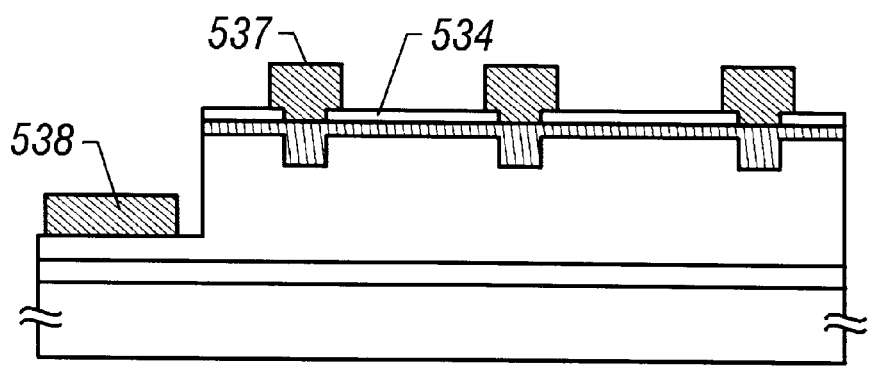

Then, the take-out electrodes 537 and 538 are formed by the same means as that in the thirteenth embodiment, to thereby complete a solar battery shown in FIG. 17C. In the solar battery thus formed according to this embodiment, since the impurity elements are basically added through the silicon nitride film 534, the n-type conductive layer 536 can be formed without any serious damage on the crystalline silicon thin film 533.

Also, since the depth of addition of the impurity elements can be adjusted by changing the thickness of the silicon nitride film 534, the joint depth of the p-n joint is easily controlled. Further, since a joint area of the crystalline silicon thin film 533 and the n-type conductive layer 536 is substantially increased, the conversion factor is expected to be improved.

(Twenty-second Embodiment)

Figure 18A:
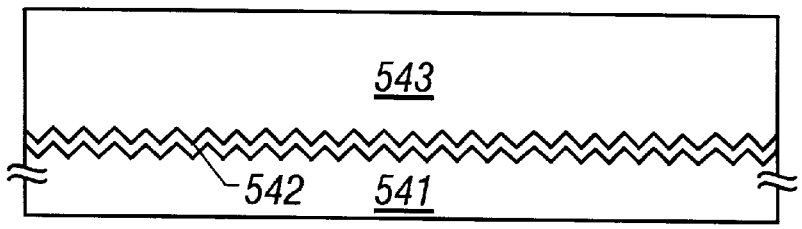
FIGS. 18A to 18D are diagrams for explanation of a process of manufacturing the solar battery in accordance with the 22nd embodiment.

A 23rd embodiment shows an example of another structure of the solar battery in accordance with the present invention. First, a crystalline silicon thin film is obtained in accordance with the thirteenth embodiment of the present invention. In FIG. 18A, reference numeral 541 denotes an ceramic substrate; 542, an under film that is formed of a silicon nitride film; and 543, a crystalline silicon thin film obtained in accordance with the present invention. A roughness is artificially formed on the upper surface of the ceramic substrate 541 through the sand blast process into a texture structure.

Then, an n-type conductive layer (a crystalline silicon thin film having n-type conductivity) 544 is formed on the crystalline silicon thin film 543 to improve crystalline property through the laser annealing. Further, a part of the crystalline silicon thin film 543 and the n-type conductive layer 544 is selectively etched and removed, to thereby obtain a state shown in FIG. 18B.

Figure 18B:
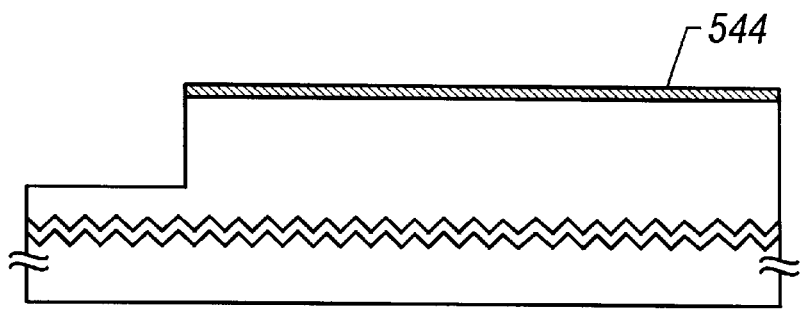

After the state shown in FIG. 18B is obtained, a thermal oxidization process is conducted to form a thermal oxide film 545 on the surfaces of the crystalline silicon thin film 543 and the n-type conductive layer 544. The thermal oxidation process may be sufficiently conducted in the oxygen atmosphere at about 500 to 700° C. It is needless to say that the thermal oxidation process may be conducted at a higher temperature.

Figure 18C:
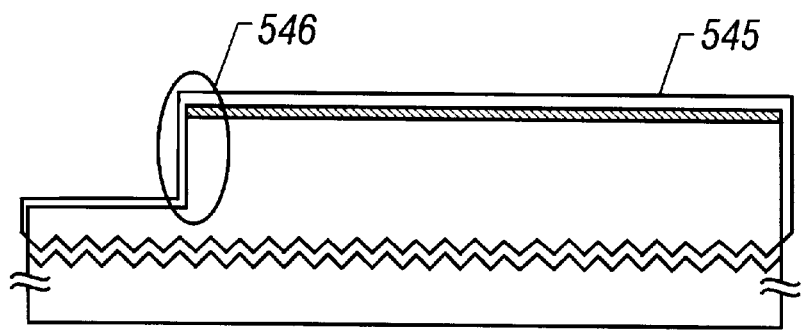

Through the thermal oxidation process, the thermal oxide film 545 is formed on side surfaces of the crystal silicon thin film as indicated by reference numeral 546. The thermal oxide film 545 thus formed on the side surfaces functions as a protective film that prevents the crystalline silicon thin film from being exposed to the air. Thus, a state shown in FIG. 18C is obtained.

Thereafter, a titanium oxide film, for example, as represented by $TiO_2$ is formed as a reflection preventing film 547. Although the thermal oxide film 545 can be used as the reflection preventing film, there is a case in which it does not sufficiently function as the reflection preventing film when its thickness is too thin. In such a case, the reflection preventing film may be preferably of a double-layer structure.

Figure 18D:
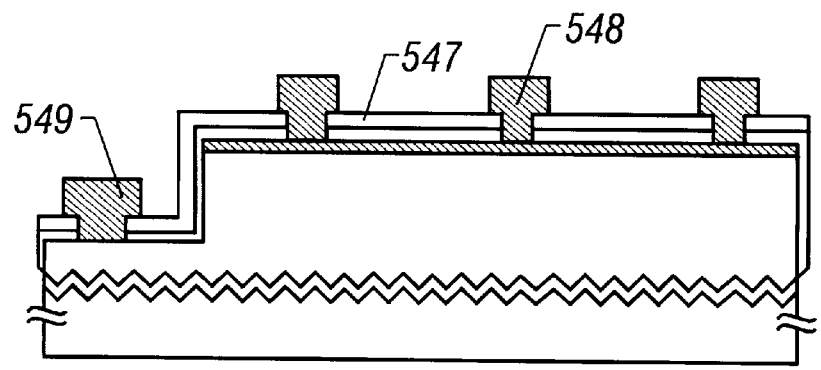

Then, contact holes are formed in a part of the thermal oxide film 545 and the reflection preventing film 547 to form take-out electrodes 548 and 549, thus completing a solar battery structured as shown in FIG. 18D.

The solar battery according to this embodiment is characterized in that since the crystalline silicon thin film is covered with the thermal oxide film 545, there exists no surface which is exposed to the air. With the structure thus formed, the solar battery can be manufactured which has a high reliability without being adversely affected by the contamination, moisture or the like from the air.

(Twenty-third Embodiment)

The present invention can be applied to a structure such as the MINP structure or the embedded electrode structure in addition to the bulk type solar battery of the p-n junction type as described in the first to twelfth embodiments, or the thin film solar battery of the p-n junction type as described in the thirteenth to twenty-second embodiments.

Since the present invention is directed to a technique by which the crystalline property of the semiconductor layer (photoelectric conversion layer) device that is a host, the structure and construction of the solar battery to which the technique is applied is not limited. Therefore, the prevent invention can be applied to the solar batteries in an extremely wide range.

(Twenty-fourth Embodiment)

The solar battery manufactured in accordance with the present invention can be used in a variety of fields. For example, the present invention can be applied to an electric calculator, a watch, a solar car (battery) as well as a home power supply system, a telephone box, an automatic vending machine, a portable equipment, a power generation system using an artificial satellite, an electric decomposing device (used in the case where a sea water is decomposed into oxygen nd hydrogen, etc.,), and the like.

In this example, an example in which the present invention is applied to a variety of uses will be described with reference to FIGS. 19A to 19D. It should be noted that what are described here are some examples, and if it is within a location where the solar light exists, the present invention can be sufficiently applied even to other uses.

Figure 19A:
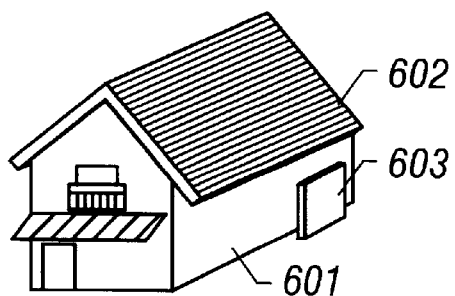
FIGS. 19A to 19D are diagrams for showing the applied examples of the solar battery in accordance with the 24th embodiment.
Figure 19B:
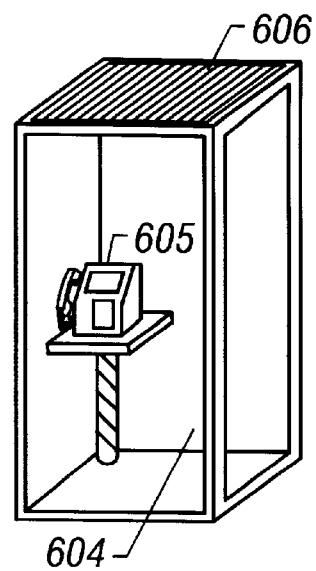

First, What is shown in FIG. 19A is a home power supply system. A photoelectric conversion device (solar battery) 602 is located integrally with a roof of a house 601. It is convenient that the roof is utilized to ensure a large area. If the conversion factor of the photoelectric conversion device 602 is improved, the area occupied with the photoelectric conversion device 602 can be reduced. Reference numeral 603 denotes a device for temporarily storing an excessive power charged during the daytime, and effectively using the power thus stored during the nighttime What is shown in FIG. 19B is a telephone box. Reference numeral 604 denotes a box; 605, a telephone; and 606, a photoelectric conversion device. Although uncountable telephone boxes are located on roads under the existing circumstances, power can be greatly saved if the solar light is used. Also, for the same reason, it is needless to say that the present invention is effectively applied to the automatic vending machines.

Figure 19C:
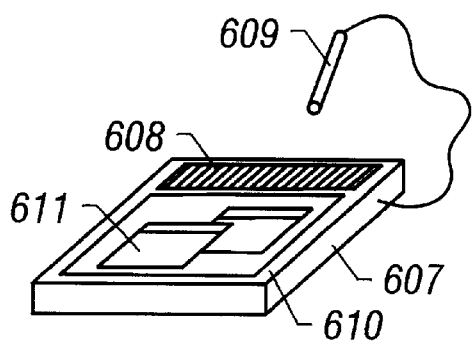

What is shown in FIG. 19C is a portable terminal equipment (mobile computer), in which reference numeral 607 denotes a main body; 608, a photoelectric conversion device as a power supply; 609, an input pen. In other words, this portable terminal equipment is an example of a touch panel where a display screen 611 appears upon depressing a screen of a liquid crystal display 610 by the input pen. Since the portable terminal equipment is required to reduce the consumed power, the photoelectric conversion device 608 can be used as a power supply.

Figure 19D:
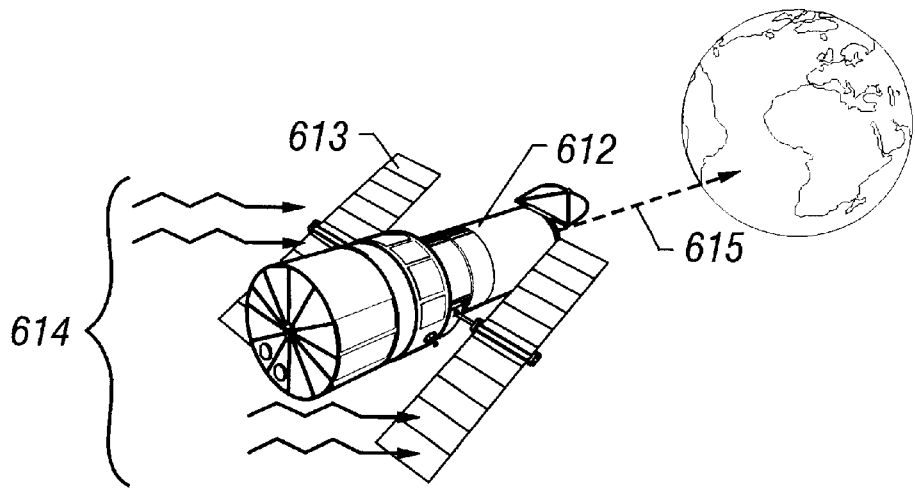
Figure 20:
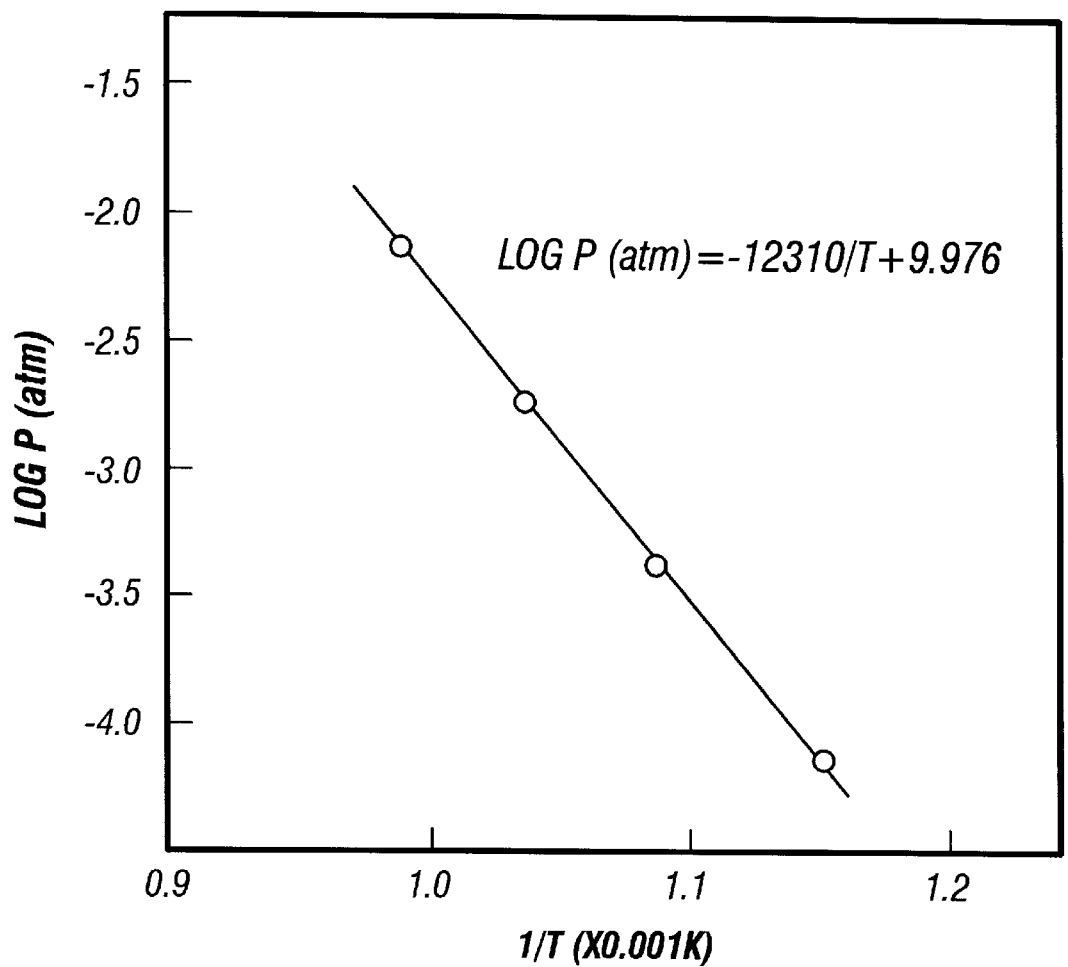
FIG. 20 is a graph representing the characteristic of a steam pressure of a nickel chloride.

What is shown in FIG. 19D is a power generation system using the artificial satellite, in which reference numeral 612 denotes a transmission unit, and 613 is a photoelectric conversion device. The transmission unit 612 is structured to provide a function as the artificial satellite and a function of converting a direct current obtained by the photoelectric conversion device 613 into microwaves.

There is advantageous in that the density of the radiant energy of the solar light 614 obtained in the space is four times as large as that of the solar light obtained on the ground, and no distinct is between the daytime and the nighttime. Therefore, the solar light 614 is received through the photoelectric conversion device 613 and the transmission unit 612 finally to the earth as the microwaves 615 for use.

Those applied products are developed for the purposes of permanently using the electric equipment at a location where a power cannot basically be supplied, and of effectively using the permanent energy source which is the solar light, and the reduction of the manufacture costs has been required to spread the those produces in the daily life.

The present invention is of an extremely effective technique in the above cases, and a very useful technique in the development of the solar battery.

Since the bulk type solar battery manufactured in accordance with the present invention can be formed using a cheap silicon substrate or the like, the manufacture costs can be remarkably reduced. Further, even in the silicon substrate (or a silicon thin film) of a relatively low grade, when the trap which is the center of the recombination of carriers such as inner defects, etc., is reduced, it has the crystalline property which is equal to that of the high grade, thereby being capable of manufacturing the solar battery that achieves a high conversion factor.

Also, the thin film solar battery manufactured in accordance with the present invention can provide a thicker thickness since the inner defects in the crystalline silicon thin film are extremely reduced even though the crystalline silicon thin film is used as the photoelectric conversion layer. In other words, the solar battery can be formed which overcomes the disadvantage that the coefficient of absorption of the crystalline silicon thin film is small, and extremely reduced in the center of re-combination.

Furthermore, since the crystalline silicon thin film obtained in accordance with the present invention is extremely reduced in the inner defects and excellent in crystalline property, the solar battery that achieves a high conversion factor can be manufactured.

The foregoing description of a preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

While the present invention has been described with reference to the preferred embodiments, it is to be understood that many modifications may be made without departing the scope of the appended claims. Also, the present invention is applicable not only to the manufacture of solar cells but also to the manufacture of other types of semiconductor devices such as MOS FET, bipor transistors or the like.

What is claimed is:

1. A method of manufacturing a semiconductor device, comprising the steps of:

forming a layer containing a metal element coupled to a semiconductor substrate having one conductivity type, said semiconductor substrate having a first crystallinity;

subjecting said semiconductor substrate and said layer containing the metal element to a first heat treatment, where said metal element is diffused into said semiconductor substrate; and subjecting said semiconductor substrate to a second heat treatment in an atmosphere containing at least one halogen element for removing said metal element from said semiconductor substrate, wherein after said second heat treatment, said semiconductor substrate has a second crystallinity higher than said first crystallinity.

2. A method according to claim 1, wherein a temperature of said first heat treatment ranges from 450 to 700° C.; and wherein a temperature of said second heat treatment ranges from 700 to 1100° C.

3. A method according to claim 1, wherein said metal element is selected from the group consisting of Fe, Co, Ni, Pt, Cu and Au.

4. A method according to claim 1, wherein said halogen element is selected from the group consisting of HCl, HF, HBr, $Cl_2$, $NF_3$, $F_2$, and $Br_2$.

5. A method according to claim 1, wherein said semiconductor substrate having said first crystallinity is a solar battery grade.

6. A method according to claim 1, wherein said semiconductor device is a photoelectric conversion device.

7. A method according to claim 1, wherein defects in said semiconductor substrate are reduced during the second heat treatment.

8. A method according to claim 1, wherein said substrate comprises a material selected from the group consisting of Si, GaAs and CdS.

9. A method of manufacturing a semiconductor device, comprising:

forming a layer containing a metal element in contact with a semiconductor substrate having one conductivity type, said semiconductor substrate having a first crystallinity;

subjecting said semiconductor substrate and said layer containing the metal element to a first heat treatment, whereby said metal element is diffused into said semiconductor substrate;

subjecting said semiconductor substrate to a second heat treatment in an atmosphere containing at least one halogen element for removing said metal element from said semiconductor substrate; and introducing an element giving the same conductivity type as said semiconductor substrate into a back surface of said semiconductor substrate, wherein said semiconductor substrate after said second heat treatment has a second crystallinity higher than said first crystallinity.

10. A method according to claim 9, wherein a temperature of said first heat treatment ranges from 450 to 700° C.; and wherein a temperature of said second heat treatment ranges from 700 to 1100° C.

11. A method according to claim 9, wherein said metal element is selected from the group consisting of Fe, Co, Ni, Pt, Cu and Au.

12. A method according to claim 9, wherein said halogen element is selected from the group consisting of HCl, HF, HBr, $Cl_2$, $NF_3$, $F_2$, and $Br_2$.

13. A method according to claim 9, wherein said semiconductor substrate having said first crystallinity is solar battery grade.

14. A method according to claim 9, further comprising a step of forming an oxide film for covering front, back, and side surfaces of said semiconductor substrate after said second heat treatment.

15. A method according to claim 9, wherein said oxide film contains P ions or B ions with a concentration of $1\times10^{16}/cm^3$ to $1\times10^{20}/cm^3$ therein.

16. A method according to claim 9, wherein said semiconductor device is a photoelectric conversion device.

17. A method according to claim 9, wherein defects in said semiconductor substrate are reduced during the second heat treatment.

18. A method according to claim 9, wherein said substrate comprises a material selected from the group consisting of Si, GaAs and CdS.

19. A method of manufacturing a semiconductor device, comprising:

forming a layer containing a metal element coupled to a semiconductor substrate having one conductivity type, said semiconductor substrate having a first crystallinity;

subjecting said semiconductor substrate and said layer containing the metal element to a first heat treatment, whereby said metal element is diffused into said semiconductor substrate;

forming a layer containing at least one element belonging to group XV on a surface of said semiconductor substrate; and subjecting said semiconductor substrate and said layer containing said element belonging to group XV to a second heat treatment for removing said metal element from said semiconductor substrate, wherein after said second heat treatment, said semiconductor substrate has a second crystallinity higher than said first crystallinity.

20. A method according to claim 19, wherein said element that belongs to group XV is selected from the group consisting of N, P, As, Sb and Bi.

21. A method according to claim 19, wherein said semiconductor device is a photoelectric conversion device.

22. A method according to claim 19, wherein defects in said semiconductor substrate are reduced by the second heat treatment.

23. A method according to claim 19, wherein said substrate comprises a material selected from the group consisting of Si, GaAs and CdS.

24. A method of manufacturing a semiconductor device, comprising:

forming a layer containing a metal element coupled to a semiconductor substrate having one conductivity type, said semiconductor substrate having a first crystallinity;

subjecting said semiconductor substrate and said layer containing the metal element to a first heat treatment, whereby said metal element is diffused into said semiconductor substrate;

selectively adding an element belonging to group XV to said semiconductor substrate to form a layer containing said element belonging to group XV;

subjecting said semiconductor substrate and said layer containing said element belonging to group XV to a second heat treatment for removing said metal element from said semiconductor substrate, and introducing an element giving the same conductivity type as said semiconductor substrate into a back surface of said semiconductor substrate, wherein after said second heat treatment, said semiconductor substrate has a second crystallinity higher than said first crystallinity.

25. A method according to claim 24, wherein said element that belongs to group XV is selected from the group consisting of N, P, As, Sb and Bi.

26. A method according to claim 24, wherein said semiconductor device is a photoelectric conversion device.

27. A method according to claim 24, wherein said substrate comprises a material selected from the group consisting of Si, GaAs and CdS.

28. A method of manufacturing a semiconductor device, comprising:

preparing a semiconductor substrate having a first crystallinity and having one conductivity type;

adding a metal element to said semiconductor substrate;

heating said semiconductor substrate with said metal element;

removing said metal element from said semiconductor substrate to reduce defects in the semiconductor substrate by second heat treatment, where said semiconductor substrate has a second crystallinity higher than said first crystallinity;, introducing an element giving the same conductivity type as said semiconductor substrate into a back surface of said semiconductor substrate to form a back surface field; and forming at least one electrode on said back surface field.

29. A method according to claim 28, wherein said substrate comprises one material selected from the group consisting of Si material, GaAs material and CdS material.

30. A method according to claim 28, wherein said metal element is segregated according to said defects in the semiconductor substrate after the heating.

31. A method of manufacturing a semiconductor device, comprising:

forming a layer including a metal element coupled to a semiconductor substrate having one conductivity type, said semiconductor substrate having a first crystallinity;

subjecting said semiconductor substrate and said layer including the metal element to a first heat treatment, where said metal element is diffused into said semiconductor substrate;

subjecting said semiconductor substrate to a second heat treatment in an atmosphere containing at least one halogen element to form an oxide film over said semiconductor substrate, where said metal element is removed from said semiconductor substrate;

adding at least one impurity element giving one conductivity type in a front surface of said semiconductor substrate, wherein said one conductivity type is different from a conductivity type of said semiconductor substrate; and adding at least one impurity element giving the same conductivity type as said semiconductor substrate is a back surface of said semiconductor substrate, wherein said conductivity in back surface of said semiconductor substrate is higher than said semiconductor substrate.

32. A method according to claim 31 wherein defects in said semiconductor substrate are reduced during the second heat treatment.

33. A method according to claim 31, wherein said metal element is selected from the group consisting of Fe, Co, Ni, Pt, Cu and Au.

34. A method according to claim 31, wherein said semiconductor substrate having said first crystallinity is solar battery grade.

35. A method according to claim 31, wherein said semiconductor device comprises a photoelectric conversion device.

36. A method according to claim 31, wherein said semiconductor device comprises a solar battery.

37. A method according to claim 31, wherein said substrate comprises a material selected from the group consisting of Si, GaAs and CdS.

38. A method of manufacturing a semiconductor device, comprising:

forming a layer containing a metal element in contact with a semiconductor substrate having one conductivity type, said semiconductor substrate having a first crystallinity;

subjecting said semiconductor substrate and said layer containing the metal element to a first heat treatment, where said metal element is diffused into said semiconductor substrate;

subjecting said semiconductor substrate to a second heat treatment in an atmosphere containing at least one halogen element to form first oxide film on a surface of said semiconductor substrate, where said metal element is removed from said semiconductor substrate;

removing said oxide film from said semiconductor substrate; and forming a second oxide film over front, back and side surfaces of said semiconductor substrate, wherein after said second heat treatment, said semiconductor substrate has a second crystallinity higher than said first crystallinity.

39. A method according to claim 38, wherein defects in said semiconductor substrate are reduced during the second heat treatment.

40. A method according to claim 38, wherein said metal element is selected from the group consisting of Fe, Co, Ni, Pt, Cu and Au.

41. A method according to claim 38, wherein said semiconductor substrate having said first crystallinity is solar battery grade.

42. A method according to claim 38, wherein said semiconductor device comprises a photoelectric conversion device.

43. A method according to claim 38, wherein said semiconductor device comprises a solar battery.

44. A method according to claim 38, wherein said substrate comprises a material selected from the group consisting of Si, GaAs and CdS.

45. A method according to claim 38, further comprising:

forming an oxide film over front, back and side surfaces of said semiconductor substrate; and exposing at least said back surface of said semiconductor substrate before forming said back surface field.

46. A method according to claim 38, further comprising:

forming a conductive region on a front surface of said semiconductor substrate by introducing an element giving the opposite conductivity type of said semiconductor substrate therein; and forming a back surface field on a back surface of semiconductor substrate by introducing an element giving the same conductivity type as said semiconductor substrate therein.

47. A method of manufacturing a semiconductor device, comprising:

forming a layer containing a metal element in contact with a semiconductor substrate having one conductivity type, said semiconductor substrate having a first crystallinity;

subjecting said semiconductor substrate and said layer containing the metal element to a first heat treatment, where said metal element is diffused into said semiconductor substrate;

adding an element belonging to group XV to a surface of said semiconductor substrate to form a layer containing said element belonging to group XV;

subjecting said semiconductor substrate and said layer containing said element belonging to group XV to a second heat treatment, where said metal element is removed from said semiconductor substrate; and forming an oxide film over front, back and side surfaces of said semiconductor substrate, wherein after said second heat treatment, said semiconductor substrate has a second crystallinity higher than said first crystallinity.

48. A method according to claim 47, wherein defects in said semiconductor substrate are reduced during the second heat treatment.

49. A method according to claim 47, wherein said metal element is selected from the group consisting of Fe, Co, Ni, Pt, Cu and Au.

50. A method according to claim 47, wherein said semiconductor substrate having said first crystallinity is solar battery grade.

51. A method according to claim 47, wherein said semiconductor device comprises a photoelectric conversion device.

52. A method according to claim 47, wherein said semiconductor device comprises a solar battery.

53. A method according to claim 47, wherein said substrate comprises a material selected from the group consisting of Si, GaAs and CdS.

54. A method according to claim 47, further comprising:

forming a conductive region on a front surface of said semiconductor substrate by introducing an element giving the opposite conductivity type of said semiconductor substrate therein; and forming a back surface field on a back surface of semiconductor substrate by introducing an element giving the same conductivity types as said semiconductor substrate therein.

* * * * *

UNITED STATES PATENT AND TRADEMARK OFFICE
CERTIFICATE OF CORRECTION

PATENT NO. : 6,133,119
DATED : October 17, 2000
INVENTOR(S) : Shunpei Yamazaki

It is certified that error appears in the above-identified patent and that said Letters Patent is hereby corrected as shown below:

<u>Title page,</u>
Item [22]; after "Filed:" please delete "July 9, 1997" and substitute -- July 8, 1997 --.

Signed and Sealed this

Twenty-seventh Day of November, 2001

*Attest:*

*Attesting Officer*

NICHOLAS P. GODICI
*Acting Director of the United States Patent and Trademark Office*